United States Patent
Chandrasekar et al.

(10) Patent No.: US 10,812,085 B2
(45) Date of Patent: Oct. 20, 2020

(54) POWER MANAGEMENT FOR MULTI-DIMENSIONAL PROGRAMMABLE LOGIC DEVICES

(71) Applicant: Intel Corporation, Santa Clara, CA (US)

(72) Inventors: Karthik Chandrasekar, San Jose, CA (US); Guang Chen, San Jose, CA (US); Wendemagegnehu T. Beyene, San Jose, CA (US); Ravi Prakash Gutala, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/234,231

(22) Filed: Dec. 27, 2018

(65) Prior Publication Data
US 2019/0131976 A1 May 2, 2019

(51) Int. Cl.
| | |
|---|---|
| *H03K 19/17772* | (2020.01) |
| *H01L 25/18* | (2006.01) |
| *H01L 23/538* | (2006.01) |
| *H01L 23/00* | (2006.01) |
| *G06F 30/34* | (2020.01) |

(Continued)

(52) U.S. Cl.
CPC ....... *H03K 19/17772* (2013.01); *G06F 30/34* (2020.01); *H01L 23/5381* (2013.01); *H01L 24/16* (2013.01); *H01L 24/17* (2013.01); *H01L 25/18* (2013.01); *H01L 2224/16145* (2013.01); *H01L 2224/16225* (2013.01); *H01L 2224/1703* (2013.01); *H01L 2224/17181* (2013.01); *H01L 2924/1431* (2013.01);
(Continued)

(58) Field of Classification Search
CPC ... H03K 19/17772; G06F 30/34; H01L 25/18; H01L 23/5381; H01L 24/17; H01L 24/16; H01L 2224/16225; H01L 2224/16145; H01L 2224/17181; H01L 2924/1431; H01L 2924/1435; H01L 2924/1433; H01L 2224/1703; H01L 2224/131; H01L 23/5383; H01L 23/5385; H01L 2224/16227; H01L 25/0652; H02M 3/156; H02M 3/04
See application file for complete search history.

(56) References Cited

U.S. PATENT DOCUMENTS 9,129,935 B1 * 9/2015 Chandrasekar ......... H01L 23/50
2019/0041923 A1  2/2019 Atsatt et al.
(Continued)

OTHER PUBLICATIONS

Larry Smith & Eric Bogatin; "Principles of Power Integrity for PDN design," Prentice Hall Modem Semiconductors, Boston, Mar. 30, 2017, p. 42.

(Continued)

*Primary Examiner* — Daniel D Chang
(74) *Attorney, Agent, or Firm* — Fletcher Yoder, P.C.

(57) ABSTRACT

A device may include a fabric die coupled to an active interposer. The fabric die may include programmable logic fabric and configuration memory that programs the programmable logic fabric. The programmable logic fabric of the fabric die may access at least a portion of the active interposer to perform an operation. As discussed herein, different power management techniques associated with the active interposer may be used to improve operation of the device.

16 Claims, 16 Drawing Sheets

(51) Int. Cl.
*H02M 3/04* (2006.01)
*H02M 3/156* (2006.01)

(52) U.S. Cl.
CPC ............. *H01L 2924/1433* (2013.01); *H01L 2924/1435* (2013.01); *H02M 3/04* (2013.01); *H02M 3/156* (2013.01)

(56) References Cited

U.S. PATENT DOCUMENTS

| | | | |
|---|---|---|---|
| 2019/0044515 A1* | 2/2019 | Gutala | H01L 25/0652 |
| 2019/0044519 A1* | 2/2019 | Atsatt | H03K 19/17796 |
| 2019/0103872 A1* | 4/2019 | Clark | H03K 19/17758 |

OTHER PUBLICATIONS

Larry Smith et al.; "On-Die Capacitance Measurements in the Frequency and Time Domains;" DesignCon; Santa Clara; Jan. 31, 2011; 25 pages.

Michael Sotman et al.; "Leveraging Symbiotic On-Die Decoupling Capacitance;" IEEE Xplore; Nov. 2005; 5 pages.

"Embedded Multi-Die Interconnect Bridge—A Breakthrough in Advanced Packaging Technology;" Intel Custom Foundry EMIB; https://www.intel.com/content/www/us/en/foundry/emib.html; Nov. 16, 2018; 2 pages.

"ANSYS Totem—Industry Proven and Foundry-Certified Analog and Mixed-Signal EM/IR solution;" https://www/ansys.com/products/semiconductors/ansys-totem; Feb. 2, 2018; 2 pages.

"Cadence—Key Benefits;" Sigrity XcitePI Extraction; https://www.cadence.com/content/cadence-www/global/en_US/home/tools/ic-package-design-and-analysis/si-pi-analysis-point-tools/sigrity-xcitepi-extraction.html; Sep. 6, 2018; 2 pages.

Cadence—VoltageStorm Transistor-Level Rail Analysis User Guide; Product Version 10.0; Cadence Design Systems, Inc.; San Jose; Dec. 2010; 198 pages.

"FPGA Architecture;" White Paper; Altera Corporation; Jul. 2006; 14 pages.

Xiaoping Liu & Yi-Feng Liu; "The Extraction and Measurement of On-Die Impedance for Power Delivery Analysis;" IEEE Xplore; Oct. 19, 2009; 4 pages.

Vaughn Betz and Jonathan Rose; "FPGA Routing Architecture: Segmentation and Buffering to Optimize Speed and Density;" international ACM Symposium Field-Programmable Gate Arrays; Feb. 21, 1999; 10 pages.

Karthik Chandrasekar et al.; "EDA Tool-based Methodology for accurate extraction of On-die Capacitance and Resistance;" DesignCon; Santa Clara; Jan. 29, 2019; 20 pages.

* cited by examiner

BASIC BUCK REGULATOR TOPOLOGY USED IN FIVR

PROGRAMMABLE FIVR

POWER MANAGEMENT FOR MULTI-DIMENSIONAL PROGRAMMABLE LOGIC DEVICES

BACKGROUND

This disclosure relates to power management techniques for use with an active interposer associated with a multi-dimensional die of a programmable logic device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that may be programmed to perform a wide variety of operations. To that end, programmable logic devices may include circuitry for sending and receiving data. For example, a programmable logic device may include programmable logic elements programmed by a form of memory known as configuration random access memory (CRAM). To program a circuit design into a programmable logic device, the circuit design, which may be compiled into a bitstream, is transmitted and loaded into CRAM cells. Once programmed (e.g., with the bitstream), the programmable logic device may perform operations associated with the circuit design. Operations may, among other things, include data transmission and/or data reception. As such, programmable logic devices may perform operations (e.g., configuration operations, logic operations) that may include data exchange.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. However, with functional versatility comes unpredictable bandwidth usage and potentially increased load demands. The unpredictability in usage may also correspond to unpredictable current changes and uneven heating of the programmable logic device.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
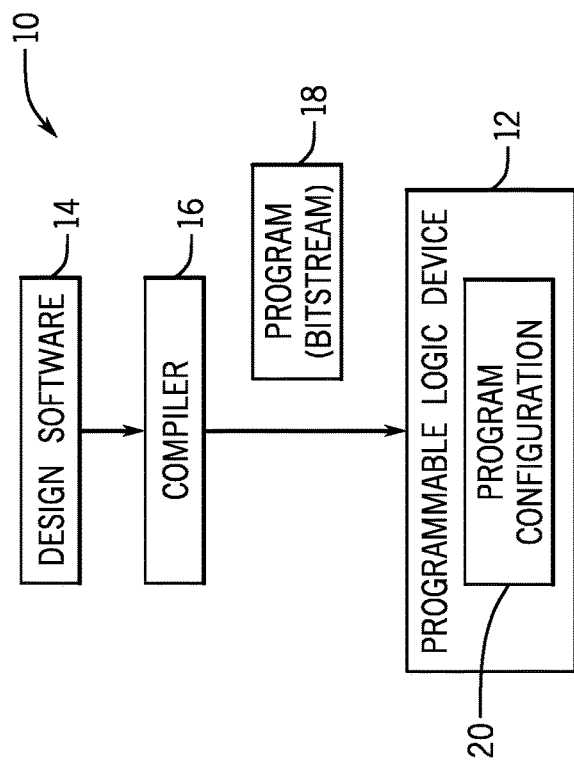
FIG. 1 is a block diagram of a programmable logic device that is programmed with a circuit design, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes the devices particularly useful for accelerating many computing tasks. Programmable logic devices are devices that may include customizable and reprogrammable circuitry that may perform digital operations and/or logic functions. To that end, programmable logic devices are programmed by loading configuration data into configuration memory (e.g., configuration random access memory (CRAM)) that may be embedded in the programmable fabric. The configuration memory may store a logic design (e.g., state machines, truth tables, functions, etc.) that may control configurable logic circuitry to facilitate performance of the programmed tasks. The flexibility in the operations of programmable logic devices also permits reprogramming of the configuration memory (e.g., programming a portion of a circuit design). For example, a system using programmable logic devices may change context (e.g., change the type of operation performed) by loading new configuration data to the configuration memory. Due to the flexibility afforded by the customizable and reconfigurable design, programmable logic devices are increasingly used as accelerators for machine learning, video processing, voice recognition, image recognition, and many other highly specialized tasks, particularly those that would be too slow or inefficient in software running on a processor. As the complexity of the tasks increase, the unpredictability of tasks the programmable logic device is used for increases, and thus considerations may be made to power consumption and power management techniques.

As discussed above, programmable circuitry in the programmable logic device (e.g., configuration memory, programmable logic elements, and embedded memory) may send and receive data (e.g., configuration data, user data, incoming data for processing by the programmable logic elements, data processed by the programmable logic data elements). The programmable logic device may perform these operations in coordination with a base die. In some embodiments, the base die is an active interposer. An active interposer may include an application specific integrated circuit (ASIC), memory, programmable logic fabric and/or a programmable logic device, or the like. In this way, processing that is performed by a fabric die or other suitable component of the programmable logic device, may be offloaded to the base die operating as an active interposer. In general, an active interposer may be considered an interposer that includes additional circuitry and/or components than merely passive couplings. For example, the active interposer may include switches, CRAM or other memory, circuitry, combinational logic, or any suitable electronic circuitry to enhance operations of the programmable logic device. Additionally or alternatively, the active interposer may also perform power management and/or regulatory operations to control voltage and/or current supplied to the programmable logic fabric of a programmable logic device.

In multi-dimensional programmable logic device applications that use an active interposer, several concerns related to power management and programmable logic device performance may arise. For example, loads of a power distribution network (PDN) of the programmable logic device may affect overall system performance. Additionally or alternatively, in multi-dimensional programmable logic device applications, one or more integrated circuit dies may be stacked on different physical levels to create the multi-dimensions of the programmable logic device. The active interposer and the fabric die may share a power supply (e.g., power source, power domain) between the different levels of the multi-dimensional programmable logic device. However, sharing a power supply may be problematic in cases where the programmable logic device uses a voltage identification bit (VID) control scheme to control operational power levels and timing.

To elaborate, the programmable logic device may be tested to verify performance at some point during manufacturing. Results of the testing may facilitate classification of the programmable logic device into an operational bin. Different operational bins may define different operating parameters (e.g., voltages supplied to at least a portion of the programmable logic device, such as a core supply voltage) for the programmable logic device. In this way, operation of the programmable logic device (e.g., voltage ranges used to operate the programmable logic device) may change based on the operational bin the device is classified into. Operational binning may permit mitigation of manufacturing variances between programmable logic devices via the adjustment of the operational parameters. Since the operational parameters are selected for each operational bin based on resulting performance metrics after the adjustment, applying the operational parameters to each programmable logic device may cause each programmable logic device to perform the same after the adjustment to the operational parameters associated with the operational bin is performed. As is described in further detail below, complications related to operational binning may arise when using stacked components that share a power supply. For example, a stacked component may not respond in a same manner as corresponding programmable logic fabric in a multi-dimensional programmable logic device to the same operational parameter adjustment.

With the foregoing in mind, the embodiments described herein are related to designs and techniques that may be used in programmable logic devices to mitigate some of these described challenges. As discussed herein, programmable circuitry may include embedded memory, such as configuration random access memory (e.g., CRAM), user memory (e.g., embedded random access memory (ERAM), M20K), and/or programmable logic fabric, such as intellectual property (IP) blocks, programmable logic elements, and other circuits implemented in the programmable logic fabric. In the present discussion, configuration data refers to data that may be loaded into the configuration memory or other embedded memory, and fabric data refers to data that is exchanged with the programmable logic fabric.

In some systems, in some embodiments the programmable logic die may be sectorized, as detailed below. In such systems, the fabric support circuitry in the base die may include network-on-chip (NOC) circuitry to send and/or receive data (e.g., configuration data, user data) with systems external to the programmable device and/or between sectors in the programmable devices. The fabric support circuitry may also include sector-aligned memory. In some embodiments, the sector-aligned memory may operate as a temporary storage (e.g., cache) for the configuration data or user memory. By incorporating the NOC into the fabric support circuitry, the NOC may resolve periphery shoreline bandwidth issues of the fabric, while increasing the bandwidth of the fabric. In addition, the communication routes available via the NOC embedded in the fabric support circuitry may enable the fabric to implement design relocations or reconfigurations, provide alternate pathways around powered-down sectors of the fabric, and provide security isolation features. The NOC may be a source of configuration data and/or fabric data and may be integrated to access the multi-purpose high-speed interface.

In addition to the above-described features, the fabric support circuitry may include, among other things, a device controller (sometimes referred to as a secure device manager (SDM)), a sector controller (sometimes referred to as a local sector manager (LSM), region controller), a configuration network-on-chip (CNOC), data routing circuitry, local (e.g., sectorized, sector-aligned, region-aligned) memory used to store and/or cache configuration programs (e.g., bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die.

By way of introduction, FIG. 1 illustrates a block diagram of a system 10 that may employ a programmable logic device 12 that may communicate via a network-on-chip disposed on a separate die that does not include programmable logic fabric, in accordance with embodiments presented herein. Using the system 10, a designer may implement a circuit design functionality on an integrated circuit, such as a reconfigurable programmable logic device 12, such as a field programmable gate array (FPGA).

The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by one or more configuration programs (bitstreams) 18, sometimes known as a program object file and/or configuration program, which programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform for machine learning, video processing, voice recognition, image recognition, or other highly specialized task.

To carry out the systems and methods of this disclosure, the programmable logic device 12 may take any suitable form that includes the multi-purpose high-speed parallel interface, which increases the speed of exchange of fabric data and/or configuration data across different portions (e.g., sectors, dies) of the programmable logic device 12. The multi-purpose parallel interface may also permit reconfiguration of portions of the programmable logic device 12 while concurrently operating a circuit design by permitting concurrent exchange of fabric data and configuration data through distinct microbump channels. As such, in one embodiment, the programmable logic device 12 may have two separate integrated circuit die coupled via the multi-purpose parallel interface. The integrated circuit dies may include controllers for the multi-purpose parallel interface, which may be hard coded circuitry, a soft IP block, and/or custom logic.

Figure 2:
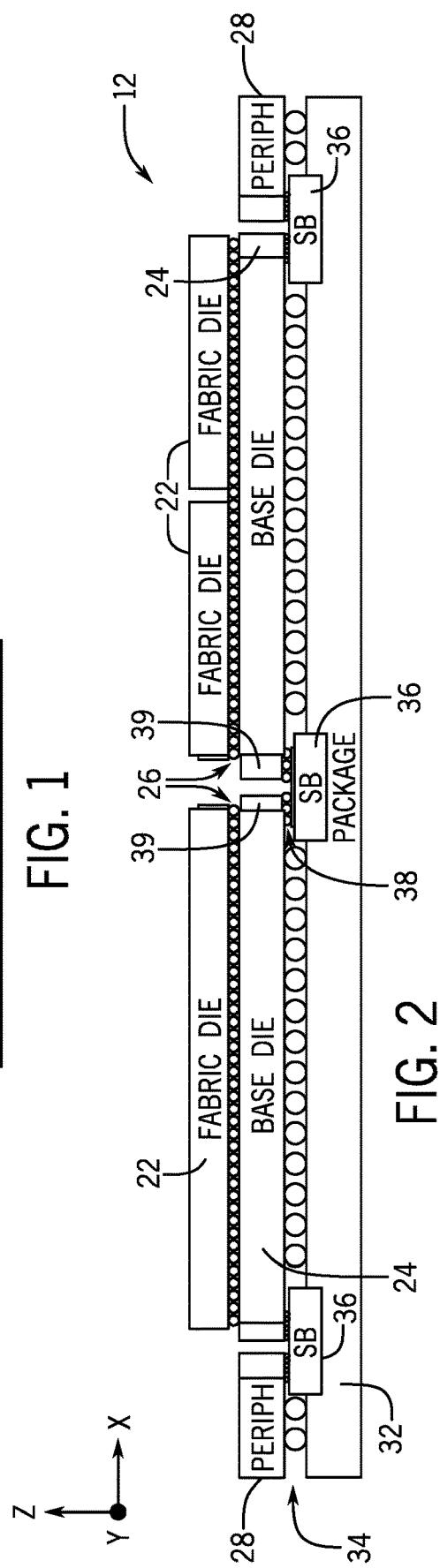
FIG. 2 is a block diagram of a package including the programmable logic device where a fabric die is vertically stacked with a base die and coupled through a multi-purpose parallel configuration interface, in accordance with an embodiment.

One example of the programmable logic device 12 is shown in FIG. 2, but any suitable programmable logic device may be used. In the example of FIG. 2, the programmable logic device 12 includes a fabric die 22 and a base die 24 that are connected to one another via microbumps 26. The microbumps 26 may couple an interface in the fabric die 22 (e.g., an FPGA microbump interface (FMIB)) to an interface in the base die 24 (e.g., a base microbump interface (BMIB)), as detailed below. In the illustrated diagram of FIG. 2, the fabric die 22 and base die 24 are illustrated in a one-to-one relationship and in an arrangement in which a single base die 24 may attach to several fabric die 22. Other arrangements, such as an arrangement in which several base die 24 may attach to a single fabric die 22, or several base die 24 may attach to several fabric die 22 (e.g., in an interleaved pattern along the x- and/or y-direction) may also be used. Peripheral circuitry 28 may be attached to, embedded within, and/or disposed on top of the base die 24. Heat spreaders may be used to reduce an accumulation of heat on the programmable logic device 12. The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Although the microbumps 26 and the microbumps 38 are described as being employed between the fabric die 22 and the base die 24 or between the edge devices, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components (e.g., NOC) described herein.

Figure 3:
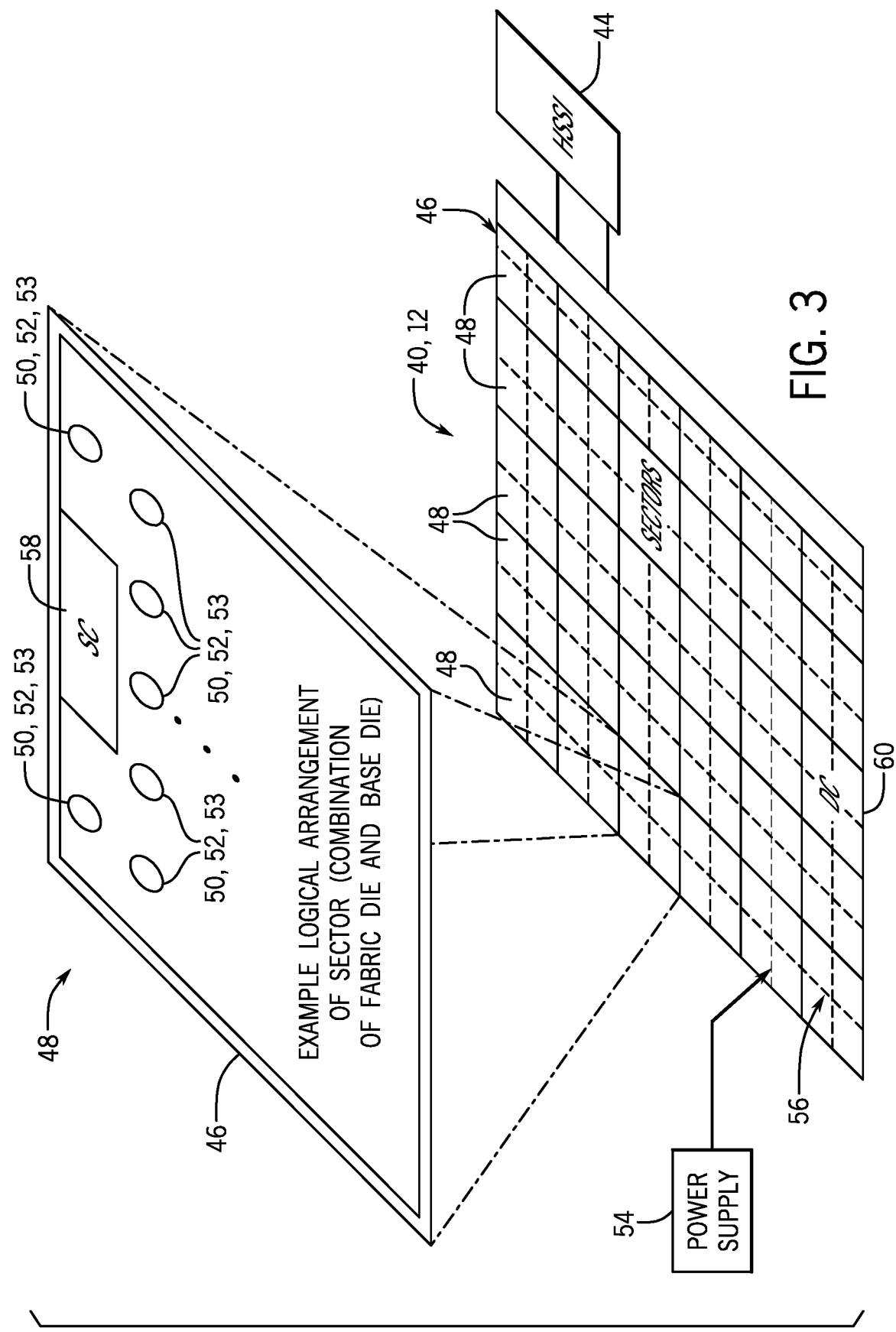
FIG. 3 is a block diagram of an example logical arrangement of the programmable logic device, in accordance with an embodiment.

In combination, the fabric die 22 and base die 24 may operate as a programmable logic device, such as a field programmable gate array (FPGA) device. For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when both the fabric die 22 and the base die 24 operate in combination. That is, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit (ASIC) and/or application-specific standard product).

In the example of FIG. 3, the FPGA 40 may include transceiver circuitry (HSSI) 44 for driving signals off of the FPGA 40 and for receiving signals from other devices. The transceiver circuitry (HSSI) may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48 (e.g., region, portion).

Each programmable logic sector 48 may include a number of programmable logic elements 50 (also referred herein as FPGA fabric) having operations defined by configuration memory 52 (e.g., configuration random access memory (CRAM)). The programmable logic elements 50 may include combinatorial or sequential logic circuitry. For example, the programmable logic elements 50 may include look-up tables, registers, multiplexers, routing wires, and so forth. A designer may program the programmable logic elements 50 to perform a variety of desired functions. The programmable logic sector 48 may also include user memory 53. User memory 53 may be in the form of embedded random access memory (ERAM), and/or memory blocks, such as M20K. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while the illustrated system includes 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 or user memory 53 based on control signals from the device controller 60. To that end and, as detailed below, the device controller 60 may employ a data register (DR) and/or an address register (AR) to access data from the configuration memory 52 or user memory 53.

In addition to these operations, the sector controller 58 and/or device controller 60 may be augmented with additional capabilities. As described herein, a high-speed parallel interface may be used to coordinate memory transactions between local in-fabric memory (e.g., local fabric memory or CRAM being used for data storage) and sector-aligned memory associated with that particular programmable logic sector 48. Moreover, a NOC may be used to facilitate memory transactions between multiple sectors, multiple dies, and between the programmable logic device and external systems, as discussed herein. NOC may further be employed for decrypting configuration programs (bitstreams) 18 (e.g., configuration data), for locally sequencing reads and writes to implement error detection and correction on the configuration memory 52 or user memory 53, and/or for sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may permit each routine to have multiple variants depending on "modes," and the local controller may be placed into any of those modes. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Sector controller 58 may include circuitry to manage the high-speed parallel interface (e.g., DR Intercept interface (DRIP)). The high-speed parallel interface may permit fast loading of DR circuitry, which may be used for configuration operations (e.g., CRAM operations), user memory operations (e.g., ERAM operations), and/or testing (e.g., scan chains operations). For example, a high-speed interface controller (e.g., DRIP Controller), located in a fabric die, and a base die DRIP Controller, located in a base die, may be used to coordinate operations in the microbump interface, and may be part of the sector controller 58. The DRIP controllers and the NOC circuitry may also coordinate operations to perform multi-sector high-speed data exchange between base die and fabric die. Each sector controller 58 thus may communicate with the device controller 60, which may coordinate the operations of the sector controllers 58 and convey commands initiated from outside the FPGA 40. To support this communication, the interconnection resources 46 may act as a network between the device controller 60 and each sector controller 58. The interconnection resources 46 may support a wide variety of signals between the device controller 60 and each sector controller 58. In one example, these signals may be transmitted as communication packets.

The FPGA 40 may be electrically programmed. With electrical programming arrangements, the programmable logic elements 50 may include one or more logic elements (wires, gates, registers, etc.). For example, during programming, configuration data may be loaded into the configuration memory 52 using pins and input/output circuitry. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to configure the gates of metal-oxide-semiconductor (MOS) transistors that control the states of the programmable logic elements 50 or programmable components of the interconnection resources 46.

Figure 4:
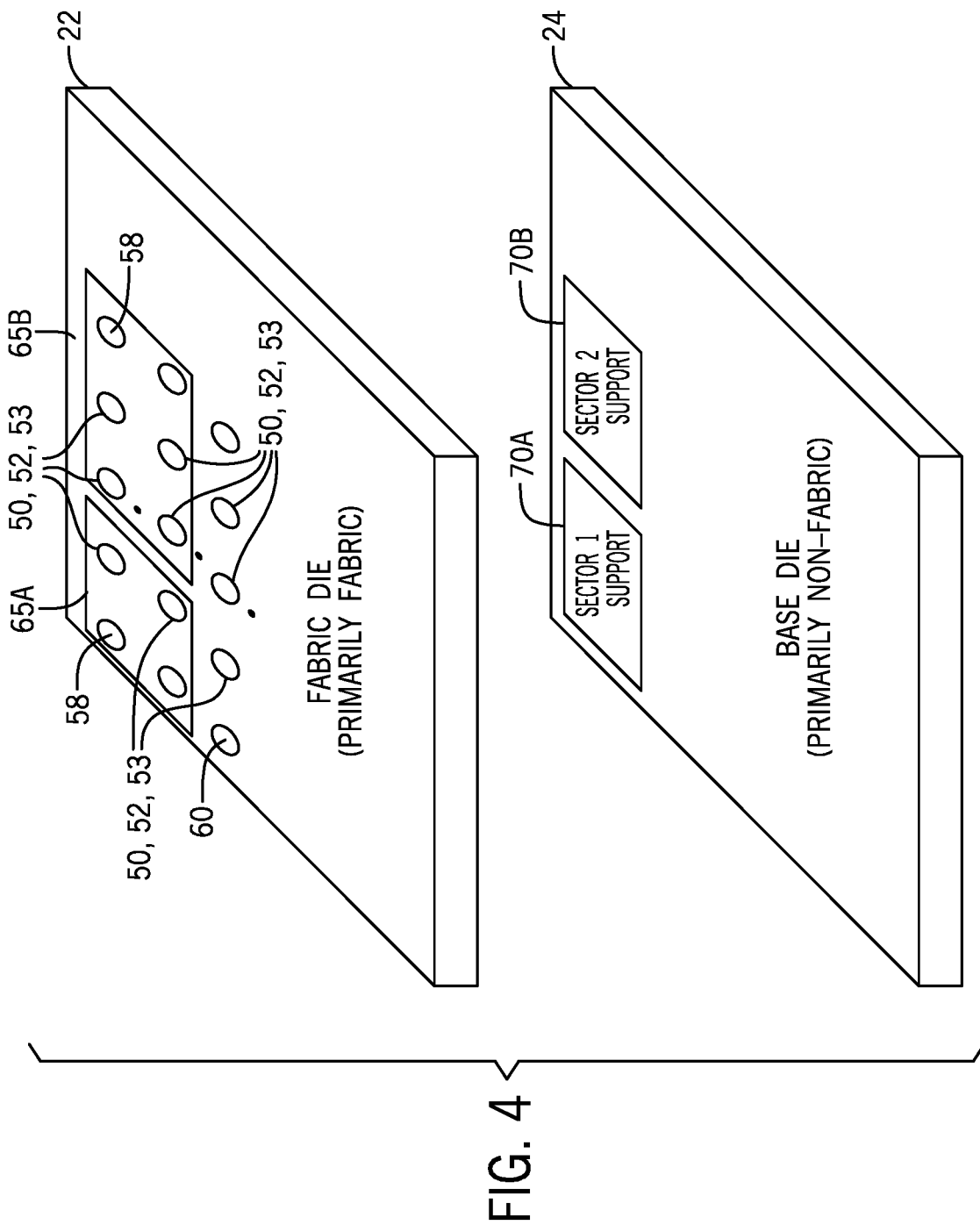
FIG. 4 is a block diagram showing a fabric die of the programmable logic device that contains programmable logic fabric with embedded memory and a base die of the programmable logic device that contains non-fabric circuitry that support operations of the fabric die, in accordance with an embodiment.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50, configuration memory 52, and user memory 53, and may be arranged in sectors such as sectors 65A and 65B. In some cases, this may also entail certain fabric control circuitry such as the sector controller (SC) 58 or device controller (DC) 60. The base die 24 may include supporting circuitry to operate the programmable logic elements 50, configuration memory 52, and user memory 53. As an example, the programmable logic elements 50 may exchange fabric data with the supporting circuitry in the base die 24 and configuration memory may exchange configuration data with the supporting circuitry in the base die 24. As shown here, the base die 24 includes support circuitry 70A, which may support fabric sector 65A, and support circuitry 70B, which may support fabric sector 65B. The base die 24 may also include support circuitry for other sectors of the fabric die 22.

Figure 5:
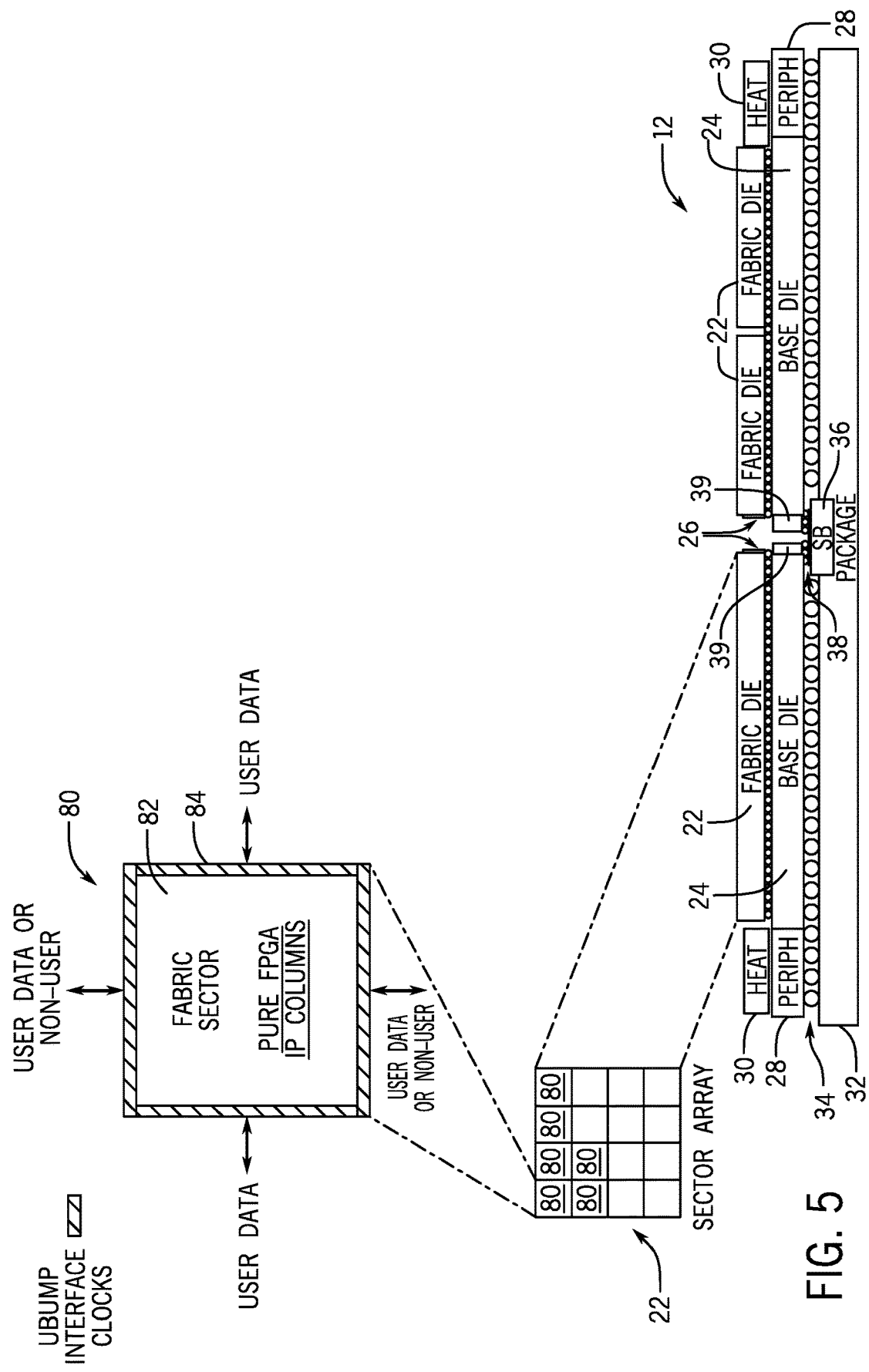
FIG. 5 is a block diagram of an example topology of the fabric die having circuitry for a multi-purpose parallel interface, in accordance with an embodiment.
Figure 6:
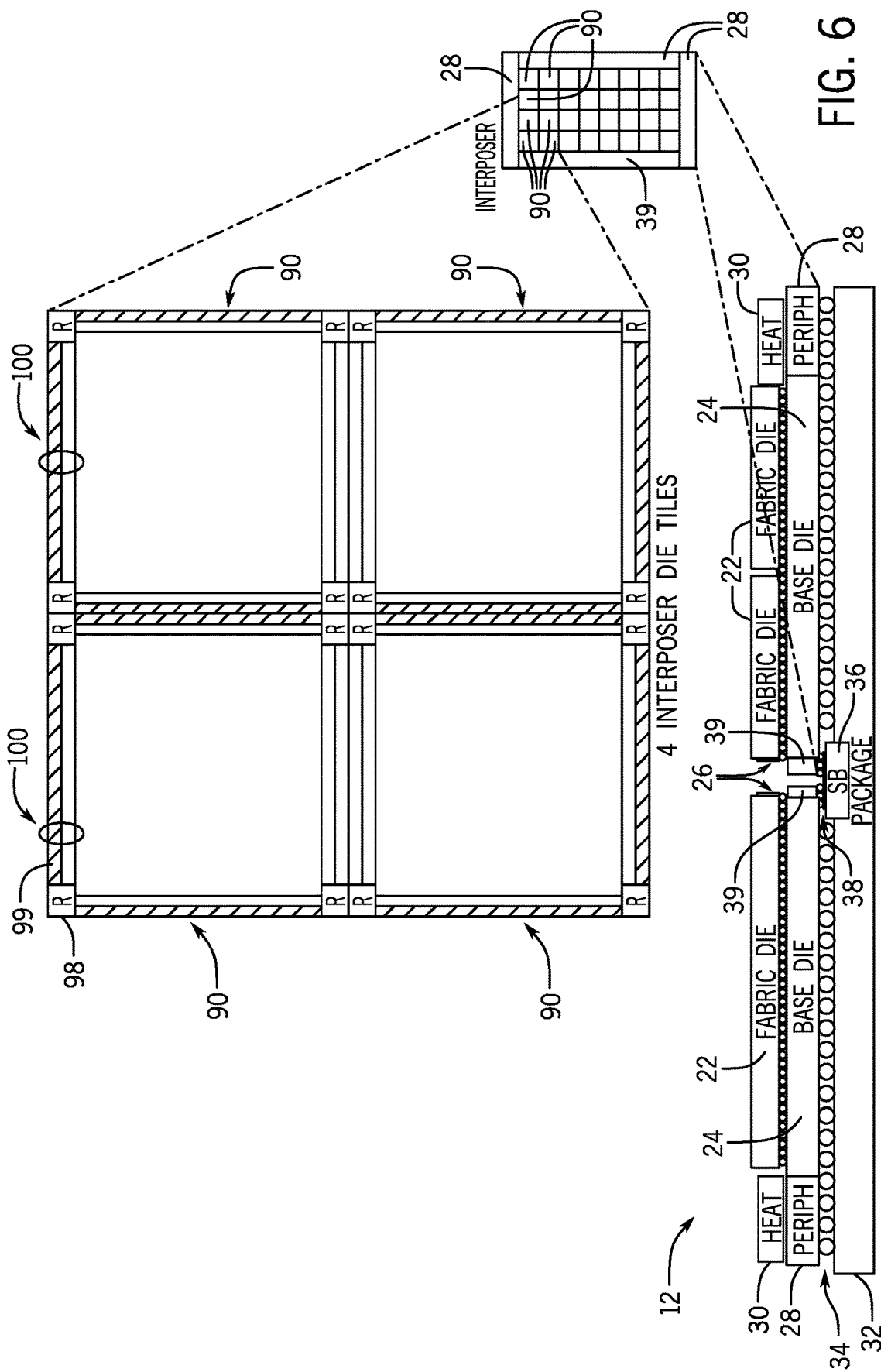
FIG. 6 is a block diagram of an example topology of the base die having an embedded network-on-chip (NOC) and of circuitry for a multi-purpose parallel interface, in accordance with an embodiment.

As discussed above, the multi-purpose interface may benefit from the presence of NOC circuitry in the base die (e.g., base die 24). The block diagrams in FIGS. 5, 6, 7, and 8 illustrate an example of a physical arrangement of the fabric die 22 and the base die 24 that may implement a NOC system. For example, a physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources or may include an interface to data routing and/or clocking resources on the base die 24. Thus, the interface circuitry 84 may connect with a microbump (µbump) interface to connect to the base die 24.

FIG. 6 provides an example complementary arrangement of the base die 24. The base die 24 may represent an active interposer with several sectors 90 surrounded by peripheral circuitry 28 and the silicon bridge interface 39. Although not shown in FIG. 6, each sector 90 may include a variety of fabric support circuitry, which may described in greater detail below. In any case, the base die 24, in some embodiments, may include data and/or configuration routers 98, and/or data or configuration pathways 99. In some embodiments, portions of the data or configuration pathways 99 may communicate data in one direction, while other portions may communicate data in the opposite direction. In other embodiments, the data or configuration pathways 99 may communicate data bi-directionally.

With the foregoing in mind, the data and/or configuration pathways 99 may make up a network-on-chip (NOC) system 100. In the embodiment depicted in FIG. 6, the NOC system 100 may be integrated between each sector 90 of the base die 24. As such, the NOC system 100 may enable each of the sectors 90 disposed on the base die 24 to be accessible to each other. Indeed, the NOC system 100 may provide communication paths between each sector 90 via routers 98 or the like. In certain embodiments, the routers 98 may route user data between sectors 90 of the base die 24, to sectors 48 of the fabric die 22, and the like. Since the base die 24 is separate from the fabric die 22, the NOC system 100 may be continuously powered on, even when various sectors 48 of the fabric die 22 are powered down. In this way, the NOC system 100 of the base die 24 may provide an available route to different sectors 48 of the fabric die 22 regardless of the positions of powered down sectors 48.

In some embodiments, the NOC system 100 may include features such as Quality of Service management, Security Management, Debug and Performance measurement and Address virtualization services, and the like. In addition, the NOC system 100 may support caching features and interconnect protocols permitting the memory components of the programmable logic device 12 to be part of a coherent memory system supported by a caching agent.

By vertically aligning the fabric die 22 and the base die 24, the NOC system 100 disposed on the base die 24 may physically span across the same surface area of the fabric die 22. In certain embodiments, microbumps may be positioned at various locations between the base die 24 and the fabric die 22 to enable the NOC system 100 to communicate data between sectors 90 of the base die 24 and sectors 48 of the fabric die 22. In the example embodiment of the NOC system 100 depicted in FIG. 6, the NOC system 100 may be positioned around each sector 90, which may be aligned with a corresponding sector 48 of the fabric die 22. As such, the NOC system 100 may provide additional horizontal and vertical routing wires or pathways to facilitate to communication between sectors 48 of the fabric die 22, between sectors 90 of the base die 24, or between sectors 48 of the fabric die 22 and sectors 90 of the base die 24. The additional horizontal and vertical lines provided by the NOC system 100 may reduce the amount of quantization performed by the programmable logic device 12.

Figure 7:
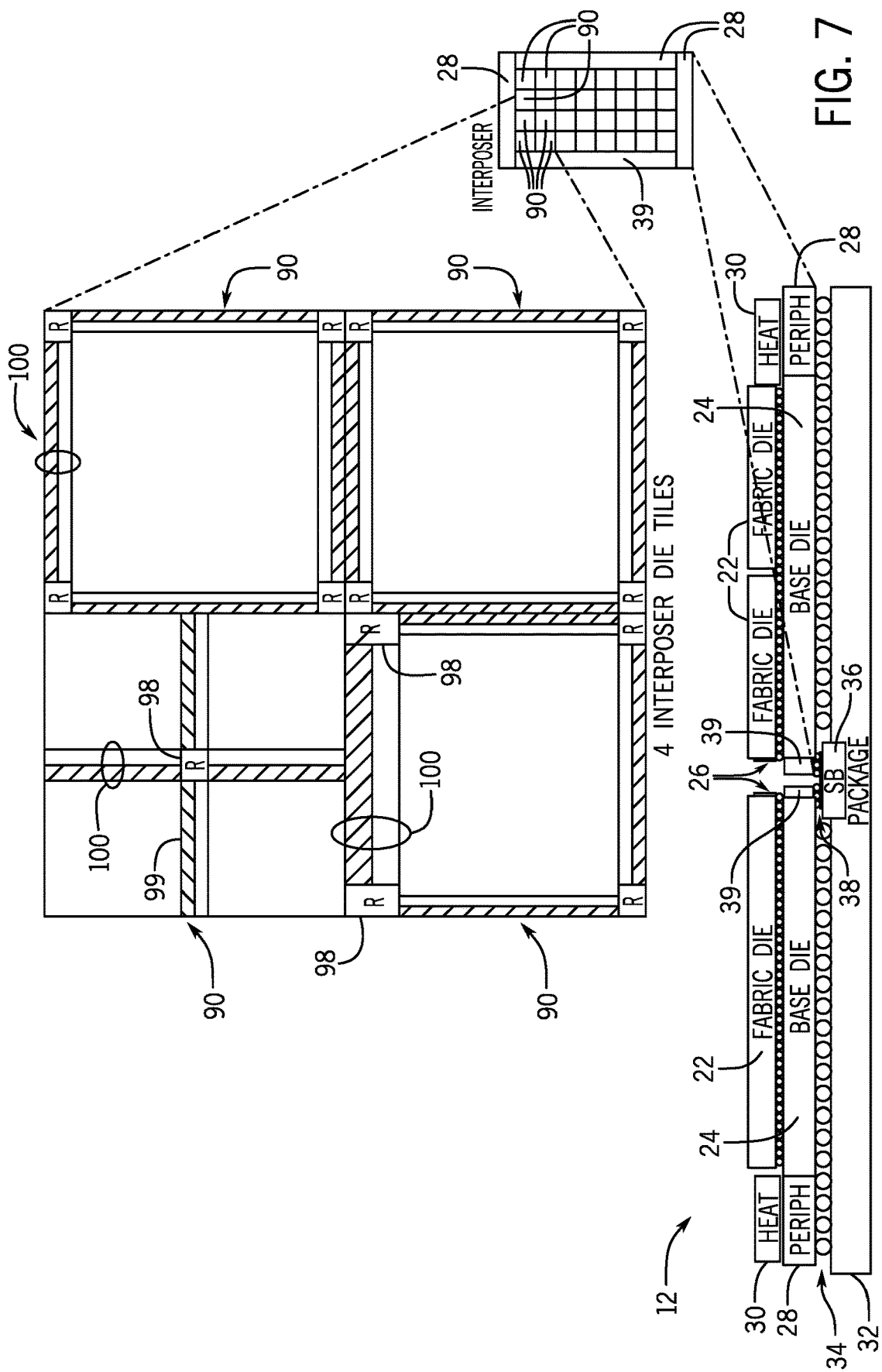
FIG. 7 is a block diagram of an example topology of the base die having circuitry for a multi-purpose parallel interface and a different configuration of the embedded NOC, in accordance with an embodiment.

Although the data or configuration pathways 99 of the NOC system 100 are illustrated in FIG. 6 as being routed around the sectors 90 of the base die 24, it should be noted that data or configuration pathways 99 of the NOC system 100 may be routed across the base die 24 in any suitable manner. By way of example, FIG. 7 illustrates the NOC system 100 implemented with data or configuration pathways 99 disposed across the center of the sector 90. As such, the router 98 may also be positioned in the center of the sector 90.

In addition, in some embodiments, the data or configuration pathways 99 of the NOC system 100 may be wider in certain sectors 90 as compared to other sectors 90. In any case, it should be understood that the data or configuration pathways 99 may be incorporated into the base die 24, such that serve desired functions or operations that may be specific to the operations performed by the programmable logic device 12. That is, if the programmable logic device 12 includes functions that involve regularly transferring data across the fabric die 22, it may be beneficial to use more of the base die 24 space to include data or configuration pathways 99 that take up more space on the base die 24 to provide increased bandwidth.

With the foregoing in mind, the NOC system 100 may include the data or configuration pathways 99 that permit for efficient multi-dimensional (e.g., three-dimensional, two-dimensional) integration of the NOC system 100 on the programmable logic device 12. Indeed, the NOC system 100 may enable the fabric die 22 to connect to the peripheral circuitry 28 and other parts of the fabric without communicating via the fabric die 22 or the programmable logic sectors 48 of the fabric die 22. That is, by employing the NOC system 100 in the base die 24, the programmable logic device 12 may increase the available bandwidth for communication across the programmable logic sectors 48 because the NOC system 100 provides additional pathways to different parts of the programmable logic device 12.

Figure 9:
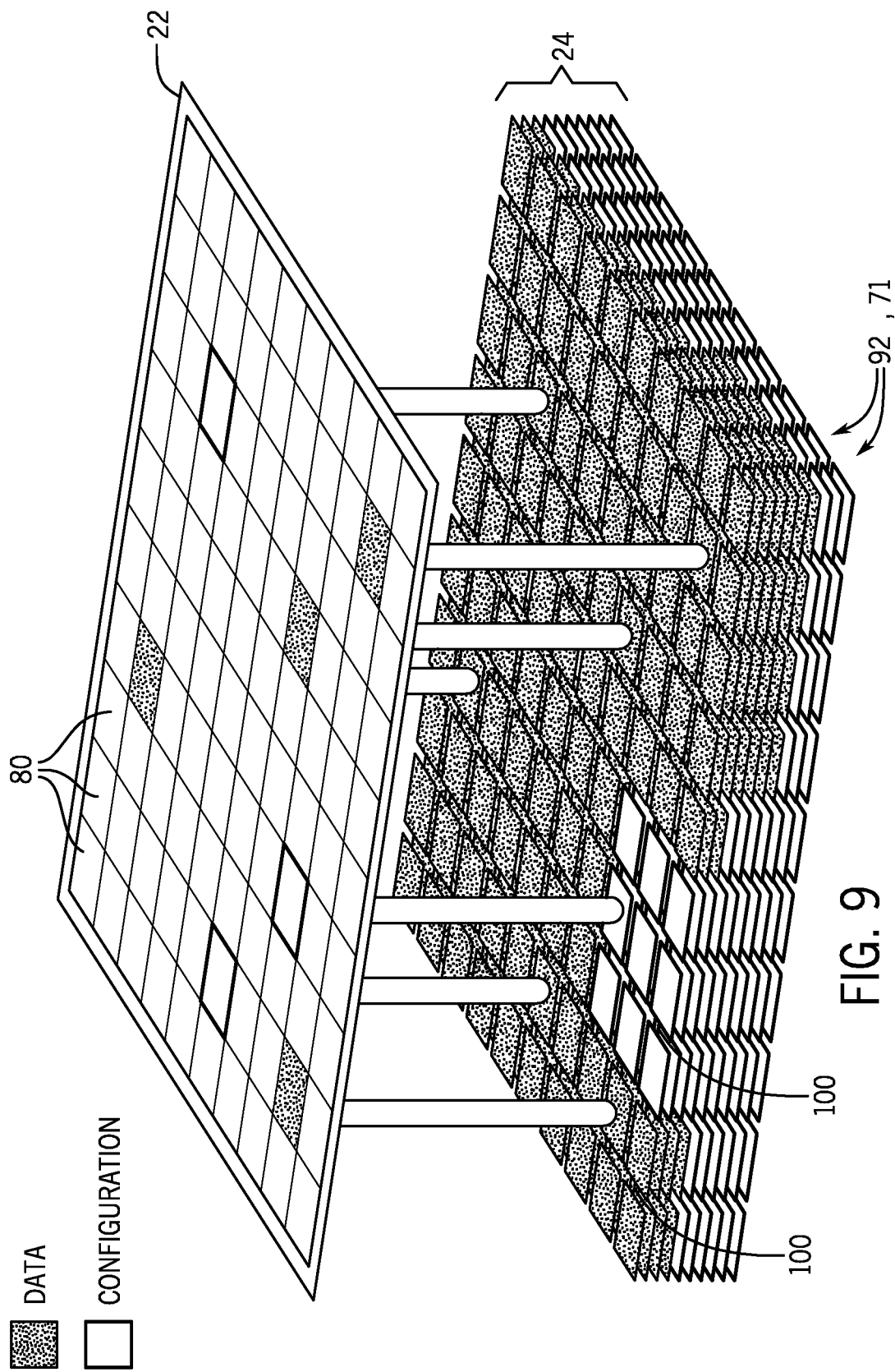
FIG. 9 is a block diagram of sector-aligned memory having embedded NOC circuitry integrated with a sector-aligned memory and configured to exchange data with the programmable logic die via the multi-purpose parallel interface, in accordance with an embodiment.

In addition, the NOC system 100 resolves shoreline issues, supports fast reconfiguration, and enables relocate-ability of functions in the programmable logic sectors 48 based on the increased bandwidth and accessibility to different portions of the fabric die 22 via the base die 24. That is, as shown in FIG. 9, the NOC system 100 may be integrated with the sector-aligned memory 92 of the base die 24, such that it spans across the entire base die 24. As such, the NOC system 100 may access different fabric sectors 80 through various routes in the base die 24. In addition, the additional routes enable the NOC system 100 to serve as functional bypass around powered down sectors 80 without affecting the performance of the programmable logic device 12 by avoiding blockages across the programmable logic sectors 48 of the programmable logic device 12. That is, in some situations, certain sectors 80 of the fabric die 22 may be powered down, thereby preventing communication across the powered down sectors 80. In this case, the NOC system 100 may provide alternate communication pathways around the powered down sectors 80 to maintain communicative connectedness across the sectors 80 of the fabric die 22 regardless of whether certain sectors 80 are powered down.

The design relocate-ability of the programmable logic sectors 48 is also enhanced by the NOC system 100 because the NOC system 100 may access different sectors 80 of the fabric die 22. That is, the increased communication flexibility provided by the NOC system 100 being disposed in the base die 24 enables the programmable logic sectors 48 to be repositioned in various sectors 80 of the fabric die 22, while maintaining communication capabilities between the relocated programmable logic sectors 48.

Although FIGS. 6 and 7 illustrate two embodiments with different configurations for the NOC system 100, it should be noted that the base die 24 may be configured to include data or configuration pathways 99 in a variety of shapes, forms, positions, and the like. For example, the data or configuration pathways 99 of different sectors 90 may overlap each other, the entire sector 90 may incorporate the data or configuration pathway 99, or the like. In addition, microbumps may be used to facilitate communication between the NOC system 100 and various sectors 80 of the fabric die 22 and the like.

Figure 8:
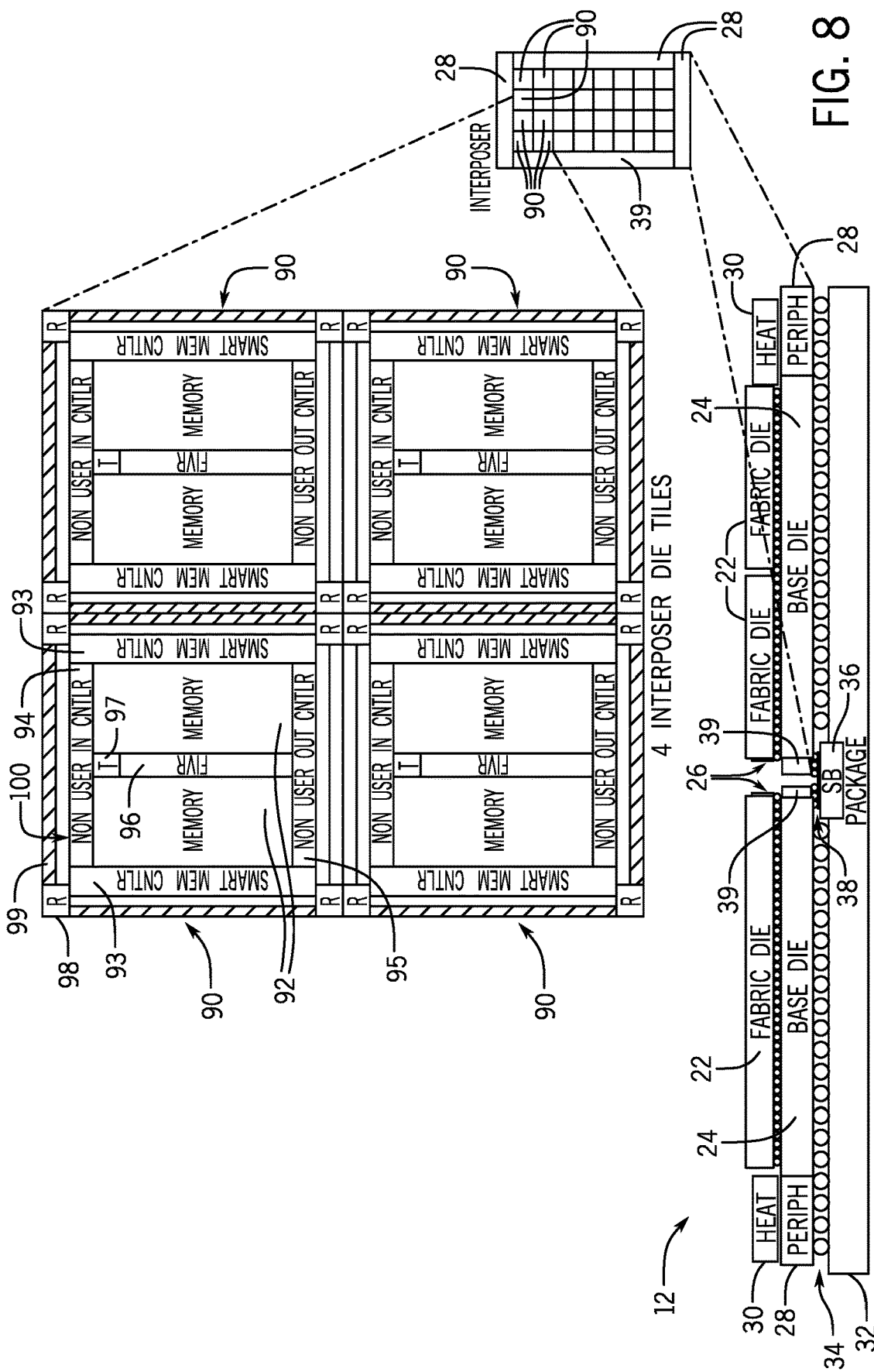
FIG. 8 is a block diagram of an example topology of the base die having circuitry for a multi-purpose parallel interface and an embedded NOC integrated with a sector-aligned memory, in accordance with an embodiment.

In addition to facilitating communication of data between sectors 90, sectors 80, and the like, the presence of the NOC system 100 in the base die 24 may also provide the programmable logic device 12 with additional circuit features by leveraging the NOC system 100 of the base die 24 to improve the communication across the fabric die 22. By way of example, FIG. 8 provides another embodiment of an arrangement of the base die 24. Similar to the base die 24 described above, the base die 24 of FIG. 8 may represent an active interposer with several sectors 90 surrounded by peripheral circuitry 28 and the silicon bridge interface 39. As shown in FIG. 8, each sector 90 may include a variety of fabric support circuitry, such as sector-aligned memory 92, memory control circuitry 93, non-user input control circuitry 94, non-user output control circuitry 95, a voltage regulator such as a fully integrated voltage regulator (FIVR) 96, one or more thermal sensors 97, data and configuration routers 98, and/or data or configuration pathways 99.

Although the following description of the additional circuit features enabled by the NOC system 100 embedded in the base die 24 focuses on the ability to transfer data to and from the sector-aligned memory 92, it should be noted that the additional circuit features are not limited to technologies involving the sector-aligned memory 92. Indeed, the NOC system 100 embedded in the base die 24 may enable a variety of circuit operations to be performed more efficiently and effectively via the programmable logic device 12. However, for the purposes of discussion, certain operations that involve the sector-aligned memory 92 and the NOC system 100 will be described to illustrate some of the functions enabled by incorporating the NOC system 100 into the base die 24.

Referring back to FIG. 8, the memory control circuitry 93 may be used to program the sector-aligned memory 92, the CRAM of the fabric die 22, or both. The non-user input control circuitry 94 and non-user output control circuitry 95 may permit the circuitry of the sectors 90 to exchange data and/or control signals (e.g., via configurable data routing network-on-chip (NOC) or a configuration network-on-chip (CNOC)). In one example, the non-user input control circuitry 94 and non-user output control circuitry 95 may operate as the sector controller (SC) 58 for a corresponding fabric sector 80 (as shown in FIG. 5).

The FIVR 96 and the one or more thermal sensors 97 may be used to provide a desired voltage to the corresponding fabric sector 80 (as shown in FIG. 5), enabling the voltage to be selectively scaled up or down, or removed, depending on power and thermal specifications (e.g., based at least in part on temperature as measured by a thermal sensor 97 and/or in accordance with a dynamic voltage and frequency scaling (DVFS) scheme). Even though the thermal sensors 97 are in a separate die from that of the programmable logic fabric elements, when the base die 24 is directly adjacent to the fabric die 22 as in this example, the temperature measured by the thermal sensor 97 in the base die 24 may sufficiently correspond to the fabric die 22 to enable temperature-based operations (e.g., turn off power to the corresponding fabric sector 80 to prevent a permanent-denial-of-service (PDOS) condition).

In certain embodiments, the data or configuration pathways 99 that make up the NOC system 100 may provide communication paths between each sector 90 via routers 98 mentioned above. As shown in FIG. 9, by vertically aligning the fabric die 22 and the base die 24 and incorporating the NOC system 100 in the base die 24, memory located in the base die 24 may be accessible in parallel to fabric sectors 80 of the fabric die 22. FIG. 9 shows an example in which sector-aligned memory 92 may be contained in the base die 24. The sector-aligned memory 92 may be directly accessible to respective fabric sectors 80 of the fabric die 22 and may contain user data (generated by or accessible by a circuit design programmed into the programmable logic fabric of the base die 24) or configuration data that may be used to program the programmable logic fabric of the base die 24. In this disclosure, "directly accessible" refers to a connection between a region of the sector-aligned memory 92 that is associated with a particular fabric sector 80 and that particular fabric sector 80. In some embodiments, each respective region of the sector-aligned memory 92 associated with a particular fabric sector 80 may be directly accessible to that particular fabric sector 80, thereby providing each fabric sector 80 with direct access to that region of the sector-aligned memory 92. For example, there may be N regions of sector-aligned memory 92 that may be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. Thus, in some cases, the same region of sector-aligned memory 92 may be directly accessible to multiple fabric sectors 80, while in other cases, a region of sector-aligned memory 92 may be directly accessible only to a single fabric sector 80. In the example of FIG. 9, the fabric sectors 80 may access specific regions of sector-aligned memory 92. The sector-aligned memory 92 is shown in FIG. 9 as vertically stacked memory. This may permit a large amount of memory to be located within the base die 24. However, the sector-aligned memory 92 may occupy a single plane of the base die 24 in some embodiments.

It should be noted that the fabric sectors 80 may initiate a transfer of data directly between memory locations of the sector-aligned memory 92 of the base die 24 using the NOC system 100, between different fabric sectors 80 of the fabric die 22, between fabric sectors 80 and memory locations of the sector-aligned memory 92, and the like. In certain embodiments, the sector controller (SC) 58 may initiate the transfer of data between sectors 80 of the fabric die 22, between memory locations of the sector-aligned memory 92, between sectors 80 of the fabric die 22 and memory locations of the sector-aligned memory 92, and the like. That is, the sector controller (SC) 58 may coordinate the operation of the NOC system 100 to facilitate the transfer of the data between the source and destination targets, as specified by the section controller (SC) 58. In some embodiments, the section controller (SC) 58 may act as a master to initiate the respective transfer and the transfer would then be performed using the NOC system 100 after the section controller (SC) 58 initiates the data transfer process.

Figure 10:
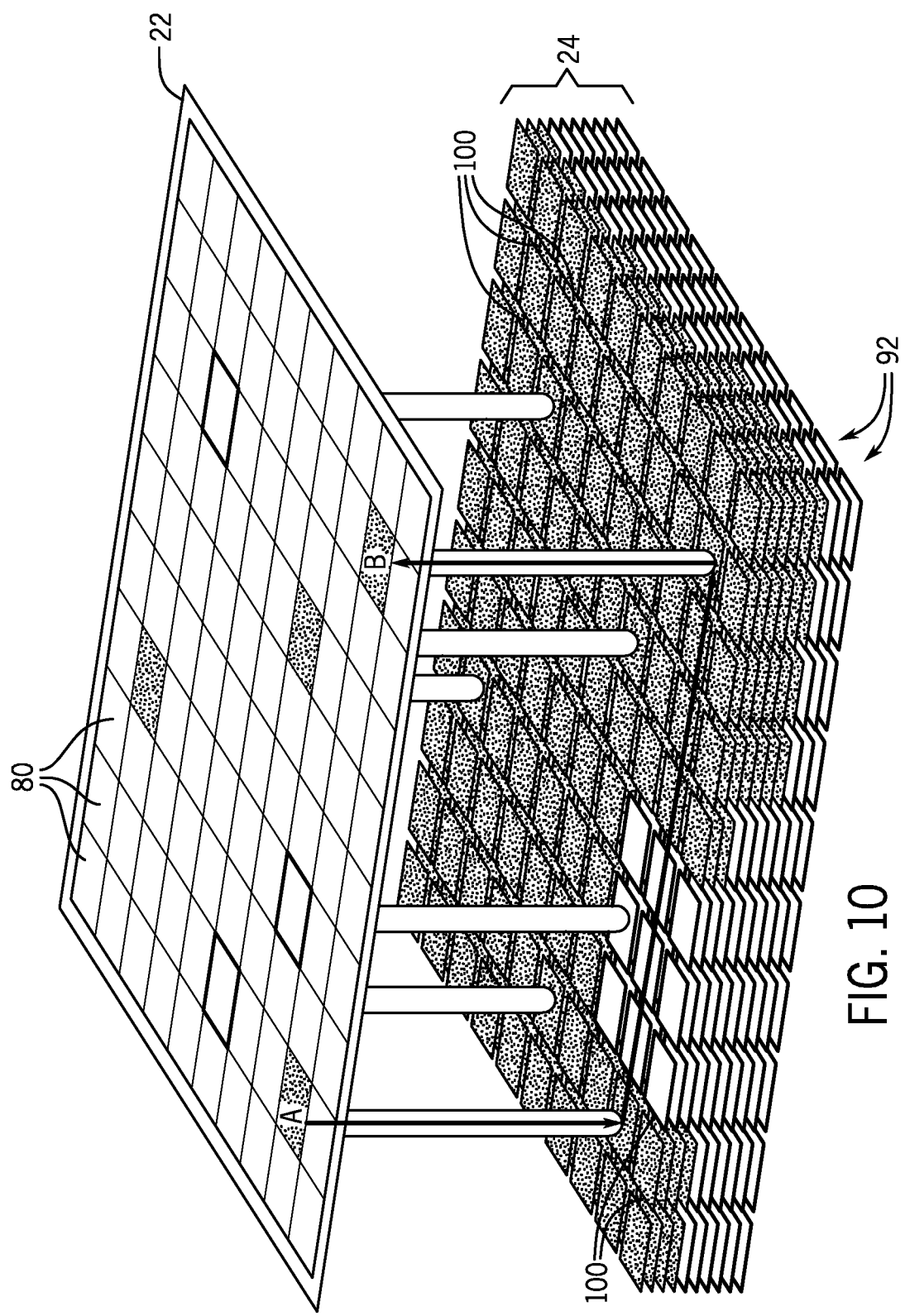
FIG. 10 is an example of data transfer between sectors of the programmable logic fabric using the system of FIG. 9, in accordance with an embodiment.

By way of example, FIG. 10 includes a block diagram of illustrating the transfer of data between sectors 80 of the programmable logic fabric via the NOC system 100 of the base die 24. Referring to FIG. 10, in one embodiment, the sector controller (SC) 58 may initiate a transfer of data from sector "A" to sector "B" of the fabric die 22 using the NOC system 100 of the base die 24. That is, the sector controller (SC) 58 may transfer data to a region of the sector-aligned memory 92 aligned with sector "A" of the fabric die 22, use the NOC system 100 to transfer the data to a second region of the sector-aligned memory 92 aligned with sector "B" of the fabric die 22, and transfer the data from the second region of the sector-aligned memory 92 to sector "B" of the fabric die 22. Although the route of the data transfer illustrated in FIG. 10 corresponds to straight paths, it should be noted that the data transferred to different sectors 80 of the fabric die 22 or regions of the sector-aligned memory 92 may use a variety of directions and routes.

Figure 11:
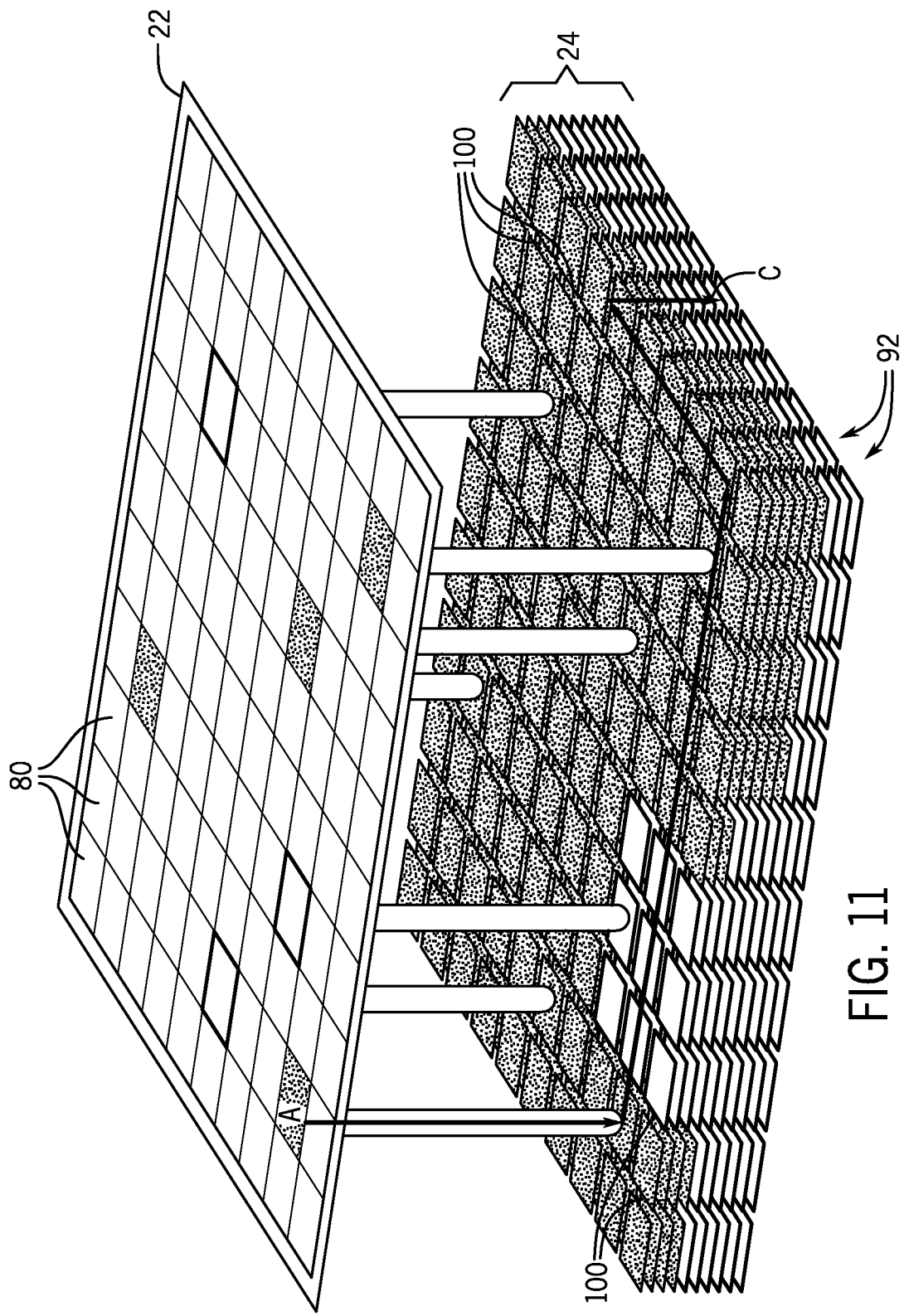
FIG. 11 is an example of data transfer from a sector of the programmable logic fabric to a memory of the sector-aligned memory using the system of FIG. 9.

In another example, FIG. 11 includes a block diagram illustrating the transfer of data from a sector 80 of the programmable logic fabric to a region of the sector-aligned memory 92 via the NOC system 100 of the base die 24. Referring to FIG. 11, in one embodiment, the sector controller (SC) 58 may initiate a transfer of data from sector "A" of the fabric die 22 to region "C" of the sector-aligned memory 92 using the NOC system 100 of the base die 24. That is, the sector controller (SC) 58 may transfer data to a first region of the sector-aligned memory 92 aligned with sector "A" of the fabric die 22 and use the NOC system 100 to transfer the data to region "C" of the sector-aligned memory 92 via different regions of the sector-aligned memory 92 or the like. Like FIG. 10, although the route of the data transfer illustrated in FIG. 11 corresponds to straight paths, it should be noted that the data transferred to different regions of the sector-aligned memory 92 may use a variety of directions and routes. It should be noted that other suitable circuits may also be employed to transfer the data in accordance with the embodiments presented herein.

As shown in FIGS. 10 and 11, the sector controller (SC) 58 may initiate a transfer of data directly between memory locations within the base die 24 using the NOC system 100. In this case, the sector controller (SC) 58 may act as the master to initiate the transfer, but then the transfers would be performed directly in the sector-aligned memory 92 and the NOC system 100 of the base die 24 after the sector controller (SC) 58 initiates the transfer. It should also be mentioned that, in some embodiments, that the sector controller (SC) 58 and similar components of the fabric die 22 may also initiate the components (e.g., memory control circuitry 93, non-user input control circuitry 94, non-user output control circuitry 95) of the base die 24 to perform transfers between the sector-aligned memory 92, the peripheral circuitry 28, and other components attached to the base die 24. As a result, data transfers may occur in the base die 24 without involvement of components in the fabric die 22.

In certain embodiments, the NOC system 100 may also enable the programmable logic device 12 to provide security isolation for one or more of the programmable logic sectors 48. That is, the NOC system 100 may be employed to communicate certain sensitive or secure data to a portion of programmable logic sectors 48 that may be designated as a security portion of the programmable logic device 12. Third party programmers may be unable to access the security portion of the programmable logic device 12 without access to the NOC system 100. Instead, the NOC system 100 may be limited to communication by certain programmers with a level of security credentials.

Introduction to Power Management Considerations in Design of Programmable Logic Devices As discussed above, the fabric die 22 may perform data transmission and processing operations in coordination with the base die 24. The base die 24 may be an active interposer. In this way, processing that is performed by the fabric die 22 may be at least partially offloaded to the base die 24. Programmable logic devices 12 (e.g., Multi-dimensional programmable logic devices) may experience unpredictable bandwidths and may share a power supply between the fabric die 22 and the base die 24. These design particulars may cause certain challenges that may be desirable to overcome. This disclosure relates generally to techniques to overcome these challenges and may be useful for implementation in designs of programmable logic devices 12. It should be understood that these techniques may also be useful in a variety of circuitry designs including multi-dimensional programmable logic devices 12, single-dimensional programmable logic devices 12, or any other suitable form of integrated circuit.

Techniques Corresponding to Power Distribution Network Considerations in Design of Multi-Dimensional Programmable Logic Devices As described above, multi-dimensional programmable logic devices 12 may experience unpredictable bandwidths between the fabric die 22 and the base die 24. Unpredictable bandwidths of data may increase currents associated with the fabric die 22 and/or the base die 24. Unpredictable bandwidths may also lead to degraded performance of the programmable logic device 12 and/or an unbalancing of a power distribution network (PDN) used to distribute power and/or electrical signals within the programmable logic device 12. Die performance may worsen because a power distribution network of the programmable logic device 12 may attempt to compensate for the change in bandwidth. This problem may increase when the programmable logic device 12 is used as an accelerator.

To elaborate, programmable logic device architectures may include an intrinsic decoupling capacitance (ODC) within its programmable logic fabric. For example, a relatively large programmable logic fabric (e.g., programmable logic core) may include 1000 nano-farads (nF) of ODC. The ODC may be a product of material properties of each transistor of the programmable logic device (e.g., gate capacitances) not involved in a current (e.g., ongoing) switching operation. Thus, inactive transistors may contribute to the overall ODC of the programmable logic device at a given moment in time. In a multi-dimensional programmable logic device application, however, a base die 24 including an application specific integrated circuit (ASIC) device may be able to benefit from the additional capacitance of the programmable logic device.

ASIC devices may be designed to perform a particular number of functions having a predetermined function (e.g., not reprogrammable like a FPGA). In this way, an ASIC device may not include a large number, or any, additional components not in use to perform that function. This is not the case with programmable logic devices (e.g., FPGAs) since programmable logic devices are designed to perform a multitude of functions based on whatever particular configuration file is programmed into the programmable logic device. In programmable logic devices, many additional transistors are included to permit the device to be able to perform a wide variety of tasks. As introduced above, these additional components and/or transistors may add ODC within the programmable logic fabric of the programmable logic device. In cases where a programmable logic device (e.g., programmable logic device 12) shares a power supply with an ASIC device (e.g., a base die 24 corresponding to an active interposer including an ASIC device), the ASIC device and the programmable logic device may benefit and experience an improved performance from the ODC of the programmable logic device.

Figure 12B:
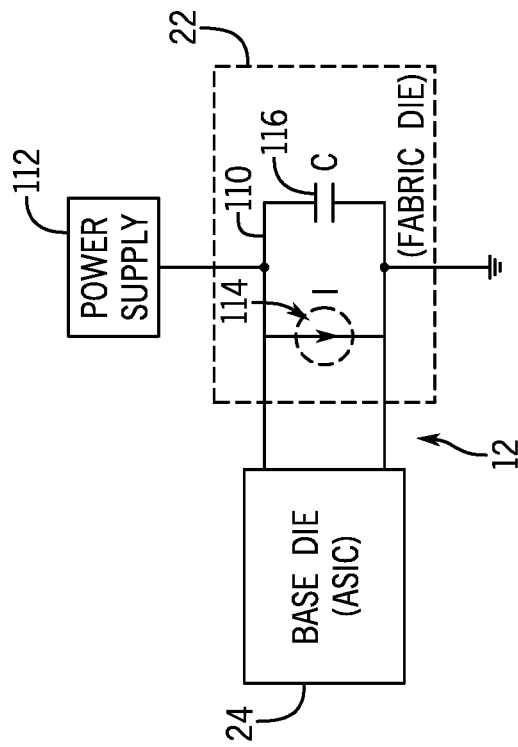
FIG. 12B is a circuit diagram of the example fabric die and the example base die of FIG. 12A, in accordance with an embodiment.
Figure 12A:
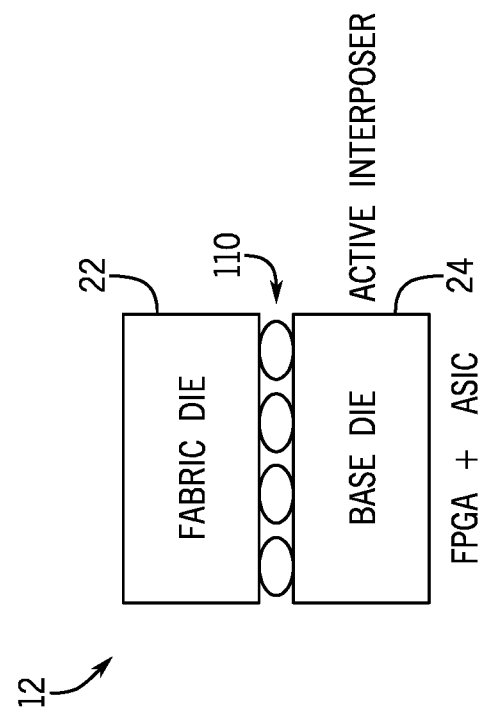
FIG. 12A is a block diagram of an example fabric die of a programmable logic device stacked on a base die of an application specific integrated circuit (ASIC), in accordance with an embodiment.

To elaborate, FIG. 12A is a block diagram of an example fabric die 22 of a programmable logic device 12 stacked on a base die 24 corresponding to an application specific integrated circuit (ASIC). FIG. 12B is a circuit diagram of the fabric die 22 and the base die 24 of FIG. 12A. FIG. 12A and FIG. 12B are described herein without particular reference back to the specific figure for ease of description. In general, a power distribution network (PDN) 110 of the programmable logic device 12 may couple a power supply 112 to both the fabric die 22 and the base die 24. The PDN 110 may be similar to the earlier-described PDN 56 and the power supply 112 may be similar to the earlier-described power supply 54.

The PDN 110 may include high and low frequency noise in its outputted signals. The high and low frequency noise may affect programmable logic device 12 usage and may be proportional to an impedance of the PDN 110 and a change in current drawn from the PDN 110, such as by loads of the PDN 110. Loads of the PDN 110 may include the fabric die 22 and the base die 24.

However, noise associated with the PDN 110 may improve (e.g., decrease, be mitigated) when ODC of the programmable logic device 12 is leveraged to provide decoupling to the base die 24 corresponding to the ASIC device. For example, unused transistors of the fabric die 22 may be tuned to provide decoupling to the base die 24, thereby improving noise associated with the PDN 110. The intrinsic ODC of the fabric die 22 may change as a function of a toggling factor that controls switching of unused components within the programmable logic fabric. A controller associated with the fabric die 22 and/or the programmable logic device 12 may adjust switching of the unused components (e.g., transistors) to tune the intrinsic ODC. Thus, by changing the toggling factor, the intrinsic ODC of the fabric die 22 may be tuned to compensate for the particular performance of the PDN 110, the fabric die 22, and the base die 24. This may be generally represented by the presence of current 114 through intrinsic capacitance 116 of the fabric die 22. The toggling may permit or prevent the current 114 from transmitting through the intrinsic capacitance 116. It is noted that although depicted as one capacitor, the intrinsic capacitance 116 represents a collective total of all the toggled intrinsic capacitance 116 affecting operation of the programmable logic device 12. In this way, toggling may affect individual current transmission associated with each additional component and/or additional transistor.

Figure 13:
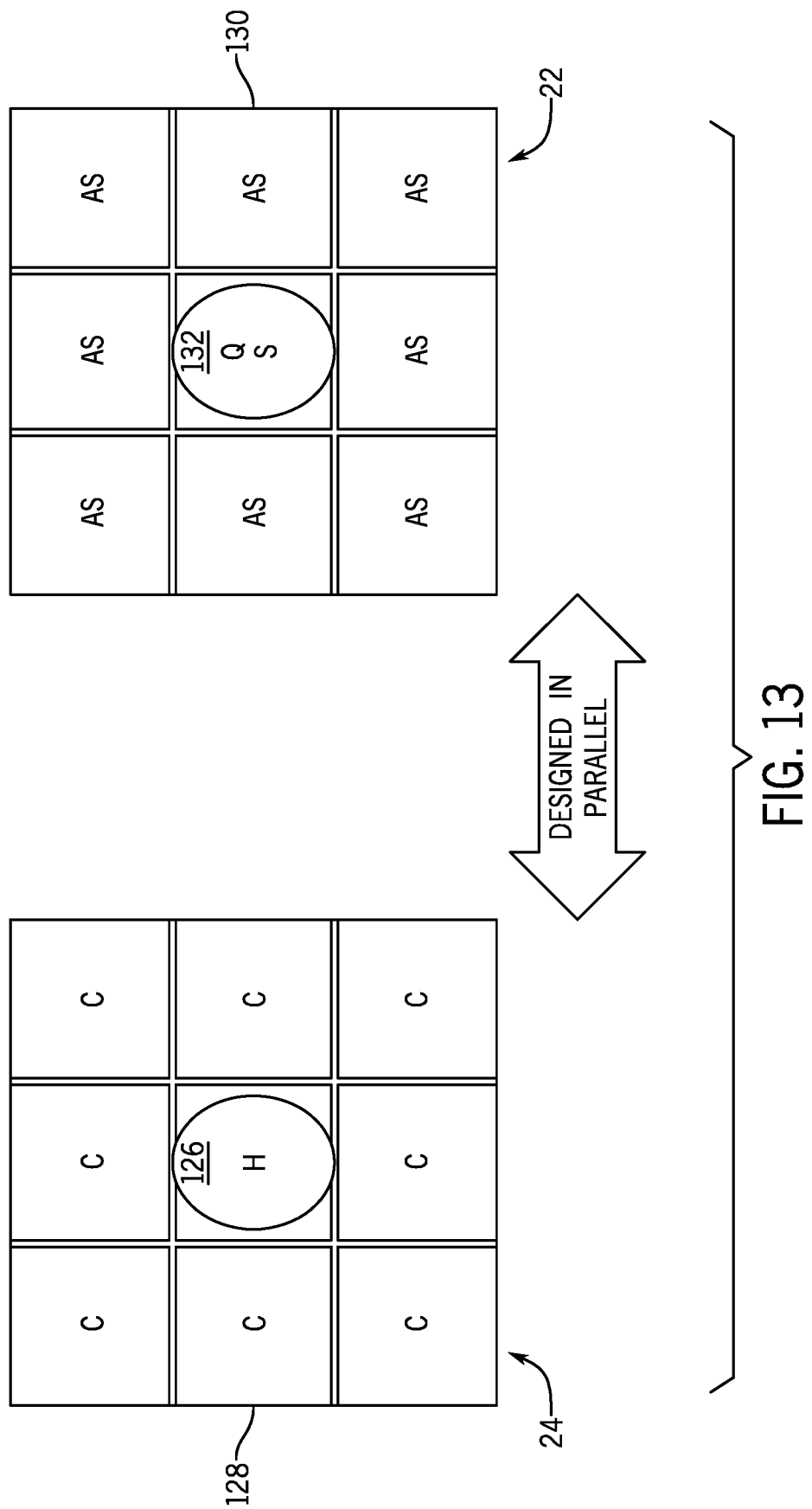
FIG. 13 is an illustration of thermal activity associated with the example fabric die and the example base die of FIG. 12A, in accordance with an embodiment.

Using thermal sensors to determine the toggling factor may improve performance when leveraging ODC of the fabric die 22. For example, FIG. 13 is an illustration of thermal activity associated with the example fabric die and the example base die of FIG. 12A. Thermal sensors (e.g., thermal sensors 97) embedded or associated with the base die 24 may sense local temperatures of the base die 24. For example, a thermal sensor may facilitate detection of a high temperature region 126 and a low temperature region 128 on the base die 24.

Design software used to design, optimize, and/or program the fabric die 22 of the programmable logic device 12 may leverage the sensed local temperatures of the base die 24 when determining how to place and route particular functions on the fabric die 22. For example, the design software may make the decision to place active sectors 130 (e.g., active circuitry, large processing operations, functions that consume large amounts of resources) above or on areas of the base die 24 that are determined to be low temperature regions 128. In a similar manner, the design software may decide to place quiet sectors 132 above or on areas of the base die 24 that are determined to be high temperature regions 126. Since the areas of high temperature regions 126 on the base die 24 may correspond to regions that experience transient currents (e.g., transient current peaks), leveraging the intrinsic ODC of the fabric die 22 may be particularly effective and lead to improvements in programmable logic device 12 operation.

In addition, considering on-die temperatures of the base die 24 and functions to be programed onto the programmable logic device 12 and/or the fabric die 22 may improve performance of the programmable logic device 12. Performance may improve because overall operating temperature of the programmable logic device 12 may be balanced and more uniform (e.g., active sectors 130 of the fabric die 22 may not be placed above or on high temperature regions 126 of the base die 24).

Figure 14A:
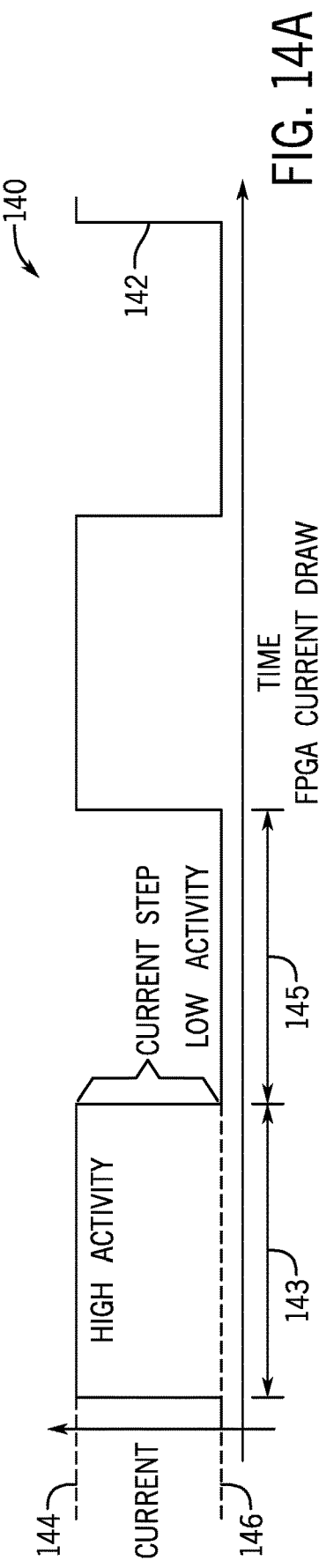
FIG. 14A is a graph of a current associated with the example fabric die of FIG. 12A, in accordance with an embodiment.

Additionally or alternatively to the techniques described above, the PDN 110 may also experience noise reductions through activity optimizations. To help elaborate, FIG. 14A is a graph 140 of a current (e.g., shown with line 142) of the fabric die 22 depicted in FIG. 12A. When the fabric die 22 consumes relatively high amounts of power (e.g., duration 143), such as during times of high activity or large amounts of processing, the current usage may be high, as indicated by level 144. However, when the fabric die 22 consumes relatively low amounts of power (e.g., duration 145), such as during times of low activity or small amounts of processing, the current usage may be low, as indicated by level 146. These levels may correspond to when the programmable logic device 12 is waiting for data (e.g., level 146) and processing received data (e.g., level 144). When current usage of the fabric die 22 changes, such as when the programmable logic device 12 changes from processing to idle, noise may be introduced into the PDN 110, which may affect performance of the programmable logic device 12. Noise caused by changes in current over time (first droop) may dominate in a fast current change case. Noise magnitude may be proportional to the change in current over time and to the inductance of the PDN 110. A relatively large change in current may create a voltage decrease and/or increase that may extend beyond a desired working voltage range associated with the silicon of the programmable logic device, compromising the silicon.

Figure 14B:
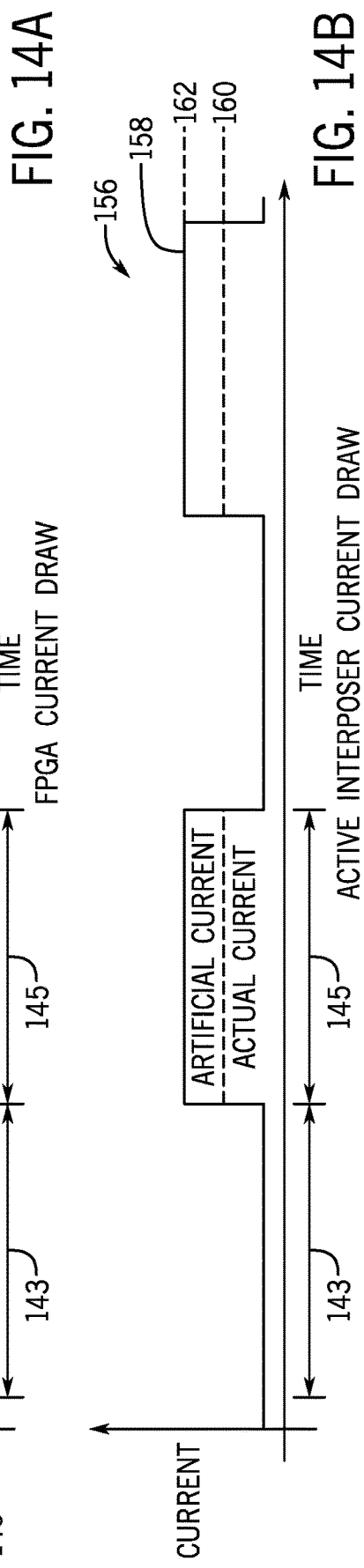
FIG. 14B is a graph of a current associated with the example base die of FIG. 12B, in accordance with an embodiment.

One solution to mitigate the effects of the PDN 110 noise from switching is to introduce artificial current into the programmable logic device 12, such as from the base die 24 (e.g., as an active interposer). FIG. 14B is a graph 156 of a current (e.g., shown with line 158) of the base die 24 depicted in FIG. 12B. The base die 24 may be designed to introduce a current higher than an initial idle current into the programmable logic device 12 circuit. As depicted, the base die 24 may originally use a current having a level 160 but may be designed to use a current having a level 162, thereby creating an artificial demand for current from the PDN 110 (by generating an "artificial current"). The durations of time that the base die 24 consumes or uses the artificially high level 162 of current correspond to the duration 145 of low activity of the fabric die 22. The change in current over time is thus smaller since the current change difference is reduced. In this way, the impact of the noise (e.g., noise caused by changes in current over time) to the PDN 110 may be mitigated and performance of the programmable logic device 12 may improve.

Figure 14C:
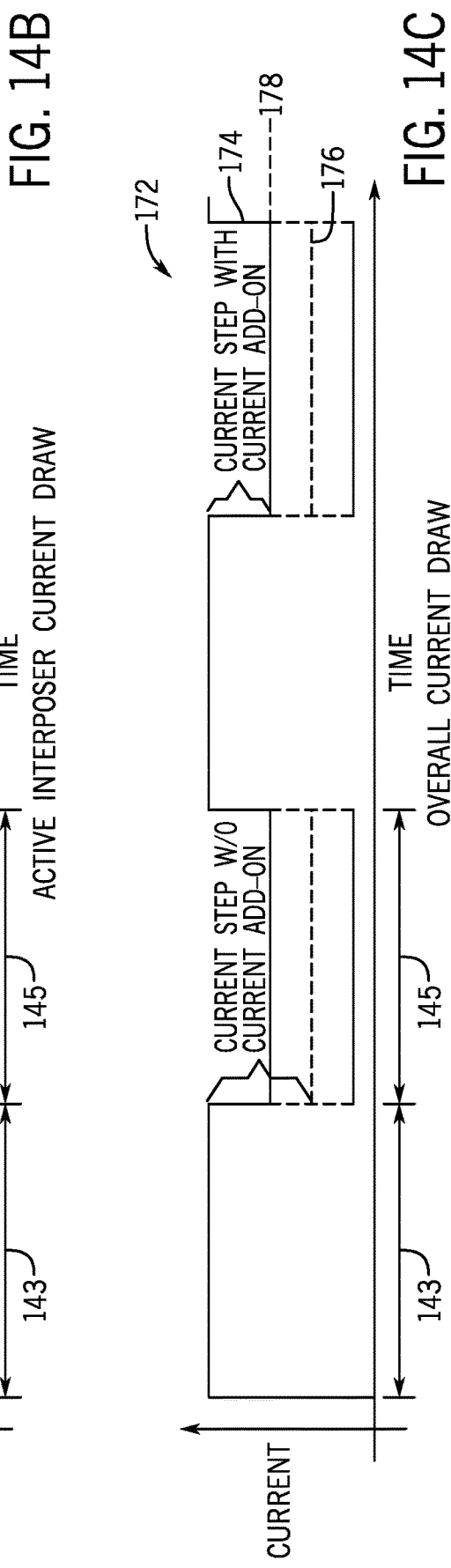
FIG. 14C is a graph of an overall current associated with the programmable logic device of FIG. 12A, in accordance with an embodiment.

FIG. 14C is a graph 172 of a current (e.g., shown with line 174) of the programmable logic device 12 inclusive of the current of the fabric die 22 (e.g., line 142) and the current of the base die 24 (e.g., line 158). The graph 172 depicts the effects of the artificial current on the overall current of the programmable logic device 12. The artificial current of the base die 24 causes the overall current to increase during the duration 145 from a low level 176 to a higher level 178. As depicted, the current step between high activity time durations and low activity time durations is reduced, helping to reduce noise without affecting usage of the fabric die 22.

Techniques Corresponding to Power Source Sharing Considerations in Multi-Dimensional PLD Design As discussed above, the fabric die 22 may perform data transmission and processing operations in coordination with the base die 24. Multi-dimensional programmable logic devices 12 may share a power supply between the fabric die 22 and the base die 24 (e.g., a power supply electrically coupled to PDN 110). The components of the programmable logic device 12 may be included on different levels creating the multi-dimensional programmable logic devices 12, and thus the base die 24 and the fabric die 22 may share a power source or power domain between the different levels. However, this may not be desirable when the base die 24 is an active interposer that includes memory or is used as memory of the fabric die 22 and the fabric die 22 is operated in accordance with a voltage identification (VID) bit control scheme. VID bit control schemes use an identifying bit, bit sequence, or other suitable identifier to classify the programmable logic device 12 into different operational bins. Programmable logic devices 12 sorted into different operational bins may each have respective programmable logic fabric (e.g., fabric die 22) that are supplied different power levels based on the respective operational bin of the particular programmable logic device 12.

To elaborate, a programmable logic device 12 as a whole may be tested at a time of manufacturing to verify its performance. For example, silicon performance at nominal voltages may vary due to process and/or manufacturing variations. Based on the results of the testing, the programmable logic device 12 may be classified into an operational bin. Voltage ranges or operational parameters (e.g., driving currents, driving voltages, switching constraints, etc.) may vary between different operational bins. For example, a supply voltage may be adjusted based on silicon speed so that silicon devices with wider ranges of speed may meet a same performance target. Changing the operational parameters between the operational bins may help promote consistent performance between manufactured programmable logic devices 12.

At some point during manufacturing, an identifier may be assigned to the programmable logic device 12 to associate the selected operational bin for the programmable logic device 12 to that particular programmable logic device 12. An example of the identifier is a voltage identification (VID) bit. Control circuitry and/or design software may reference the identifier during programming and/or configuration of the programmable logic device 12 for defining of the operational parameters of the programmable logic device 12.

In general, it may be desirable to share a power supply between layers of a multi-dimensional programmable logic device 12. For example, power sharing reduces silicon, reduces packaging, and reduces an overall size of the final product. However, when a multi-dimensional programmable logic device 12 uses a voltage identification bit (VID) to control operational power levels and timing, sharing a power supply between layers of the multi-dimensional programmable logic device 12 may be problematic. For example, a layer of the multi-dimensional programmable logic device 12, such as a memory device layer, may be more sensitive to power swings or changes in voltage associated with the VID bit control than digital logic of the fabric die 22.

Figure 15:
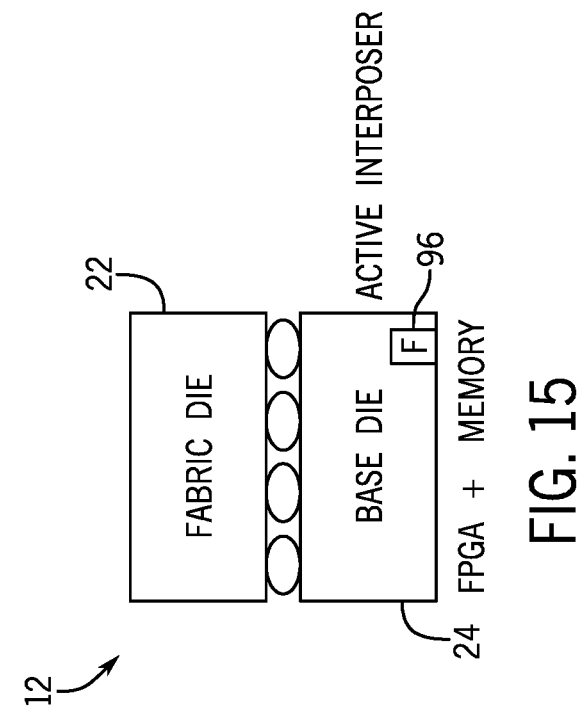
FIG. 15 is a block diagram of an example fabric die of a programmable logic device stacked on a base die of memory that includes a fully integrated voltage regulator (FIVR), in accordance with an embodiment.

One solution to this may be to use a fully integrated voltage regulator (FIVR) 96 within the active interposer (e.g., base die 24) of the multi-dimensional programmable logic device 12 to power the fabric die 22 independent of the PDN 110 (e.g., depicted in FIG. 12B) supplying the base die 24. To help illustrate, FIG. 15 is a block diagram of an example fabric die 22 of a programmable logic device stacked on a base die 24 of memory that includes a fully integrated voltage regulator (FIVR) 96. As described above, the fabric die 22 is coupled to the base die 24 to jointly perform processing operations, among other functions. The FIVR 96 may be included in the base die 24 to reduce or eliminate a reliance of the fabric die 22 on the power supply to the base die 24 (e.g., such as, power supply 112 depicted in FIG. 12B of the PDN 110).

There may be particular advantages to including the FIVR 96 in the base die 24. For example, including the FIVR 96 in the fabric die 22 may use an increased amount of area or physical space, and thus it may be cheaper to include the FIVR 96 in the base die 24. The FIVR 96 may be used to exclusively power the fabric die 22 independent of the base die 24. In this way, the FIVR 96 may be used in VID control schemes to supply programmable logic fabric (e.g., fabric die 22) of the multi-dimensional programmable logic device 12 with a different supply voltage than the base die 24 (e.g., associated with memory and therefore is more sensitive to voltage drops than digital logic of the fabric die 22). Furthermore, using the FIVR 96 to power the fabric die 22 may minimize a value of inductance used in the FIVR 96 design because of the relatively high peak current associated with the core power domain of the fabric die 22. This may permit an inductor implementation of the FIVR 96 within the silicon of the base die 24 to have relatively high efficiencies and lower losses when compared to implementations using the FIVR 96 within the fabric die 22 for powering both the core power domain and the input/output (I/O) power domain.

Figure 16A:
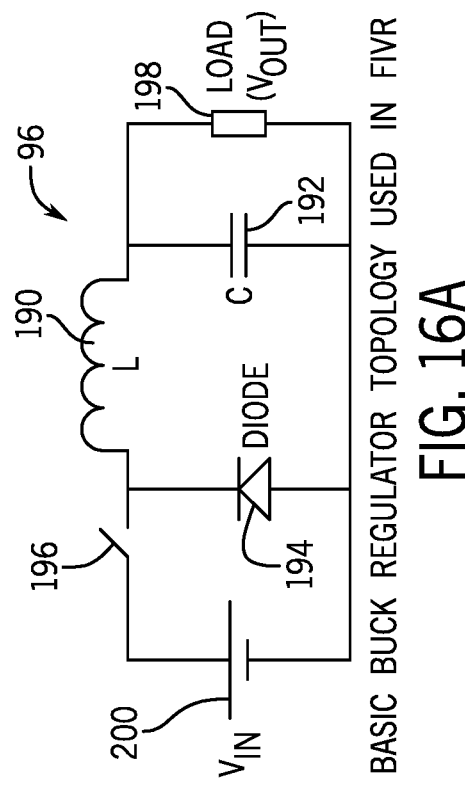
FIG. 16A is a circuit diagram of the FIVR of FIG. 15, in accordance with an embodiment.

FIG. 16A is a circuit diagram of an example FIVR 96. As depicted, the FIVR 96 is a basic Buck regulator. The Buck regulator features an inductor 190 and a capacitor 192, which together form a filter (e.g., low-pass filter). A diode 194 transmits current from the inductor 190 through the circuit when a switch 196 is open and is reverse-biased when the switch 196 is closed. This circuit may be considered a converter since the voltage output across a load 198 is different from the voltage input from a voltage supply 200. For example, the FIVR 96 may permit the voltage input to be selectively scaled up or down, or removed, depending on power and thermal specifications. The earlier described PDN 110 may electrically couple to the voltage supply 200. In this way, the FIVR 96 may be designed based on an expected peak current of the programmable logic fabric or a modelled peak current of the programmable logic fabric.

Figure 16B:
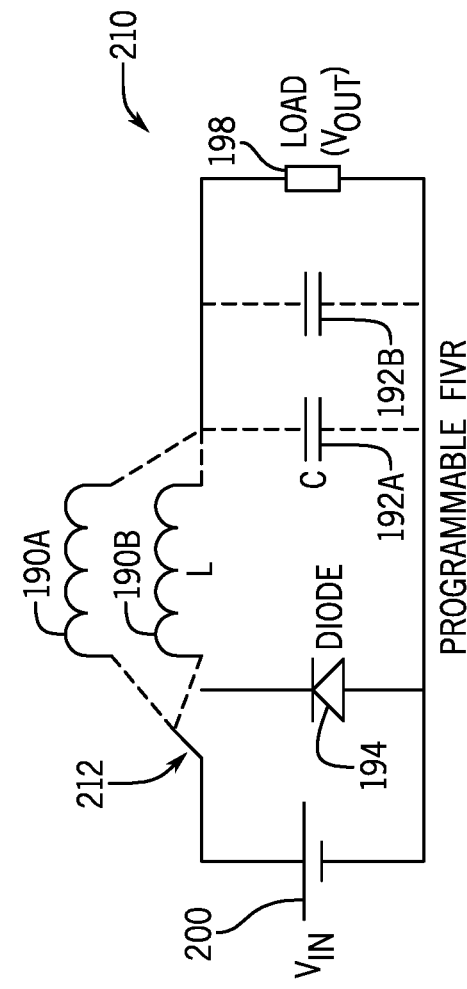
FIG. 16B is a circuit diagram of another example of the FIVR of FIG. 15, in accordance with an embodiment.

However, some active interposer applications may have an unpredictable peak current. To mitigate the impact of the unpredictable peak current on performance of the fabric die 22, a programmable FIVR may be used. FIG. 16B is a circuit diagram of another example of the FIVR 96, a programmable FIVR 210. The programmable FIVR 210 operates similar to the FIVR 96 except that a switching device 212 switches between inductors 190 (e.g., 190A, 190B) and capacitors 192 (e.g., 192A, 192B) in response to a sensed peak current value. In this way, the programmable FIVR 210 may respond in-real time to changes in peak current value. This may help establish the impedance of the programmable FIVR 210 to a suitable value for the peak current value. Thus, as the peak current changes, the programmable FIVR 210 may dynamically update to respond to the peak current value.

In an actual implementation, a system controller may select a range of inductance and/or capacitance values based on application requirements. The base die 24 (e.g., active interposer) may include one or more components used to generate the range of inductance and capacitance values and the switching device 212. The system controller may activate the switching device 212 to select one or more of the inductors 190 and/or one or more of the capacitors. The system controller may select the impedances based at least in part on a sensed peak current value. Temperature sensors, such as thermal sensors 97, may facilitate the system controller monitor any surges in computing associated with the programmable logic device 12.

Techniques Corresponding to Device Cooling Considerations in Multi-dimensional PLD Design In addition to considerations described above, multi-dimensional programmable logic devices 12 may have relatively high heat densities. The ability to cool the stacked device layers may be a bottleneck of the design of the multi-dimensional programmable logic device 12. These heat distribution issues may include different portions of the stacked layers emitting unequal amounts (e.g., uneven distributions) of heat during operation. In this way, stacking components such that at least two components emitting relatively high amounts of heat during operation are disposed close to each other may exaggerate and increase a relative temperature of the stacked die. Increasing temperatures of regions of the FPGA may affect performance of the FPGA. Thus, it may be desirable to develop the multi-dimensional programmable logic device 12 with consideration to effectiveness of the cooling techniques.

As described above in discussions related to FIG. 13, one cooling technique may including providing dual consideration to expected processing and thermal outputs of the base die 24 and of the fabric die 22 during a circuit design for the multi-dimensional programmable logic device 12. When considering the relative temperatures and processing of each component and/or stacked layer, final circuit designs may have an improved consideration since the designs were jointly considered and finalized.

Another technique may include dynamic performance scaling of the fabric die 22 in response to sensed temperatures. This may permit adjustment of the performance of the multi-dimensional programmable logic device 12 in response to real-time determinations of processing and/or thermal outputs associated with the fabric die 22, or any other suitable component. Temperatures associated with the fabric die 22 may be sensed using any suitable temperature sensing techniques, such as a technique involving embedded thermal sensors 97 of the base die 24 or thermal sensors embedded in the fabric die 22.

Figure 17A:
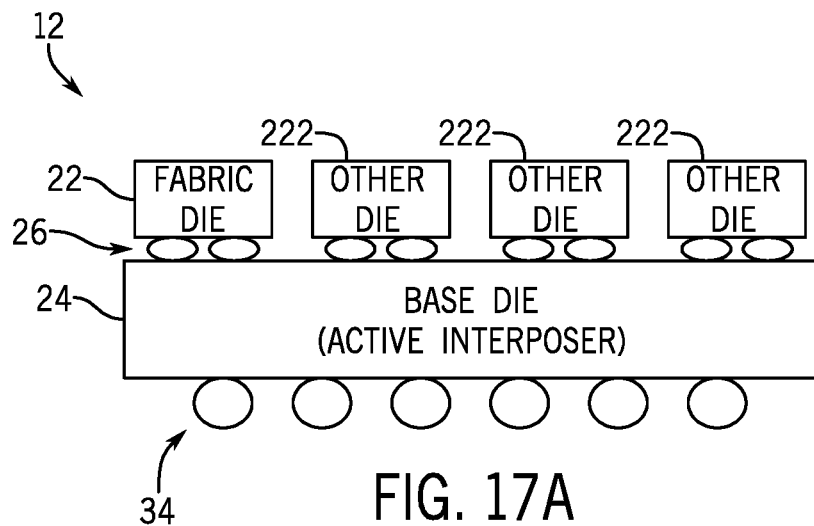
FIG. 17A is a block diagram of an example fabric die of a programmable logic device stacked on a base die operating as an active interposer, in accordance with an embodiment.

To elaborate, FIG. 17A is a block diagram of the fabric die 22 stacked on the base die 24 (e.g., an active interposer). Other die 222 may also be disposed on the base die 24. For example, the other die 222 may include any combination of memory, transceiver, ASICs, and/or any suitable circuitry that may also be used in addition to the fabric die 22 in the multi-dimensional programmable logic device 12. In this example, the base die 24 couples through communicative and/or physical couplings (e.g., C4 bumps 34, microbumps 26, microbumps 38) to other circuitry described above. It may be desirable to maintain the temperature of the fabric die 22 at a particular amount. For example, an uncontrolled or relatively high temperature of the fabric die 22 may affect performance of the other die 222 in an undesirable way.

Figure 17B:
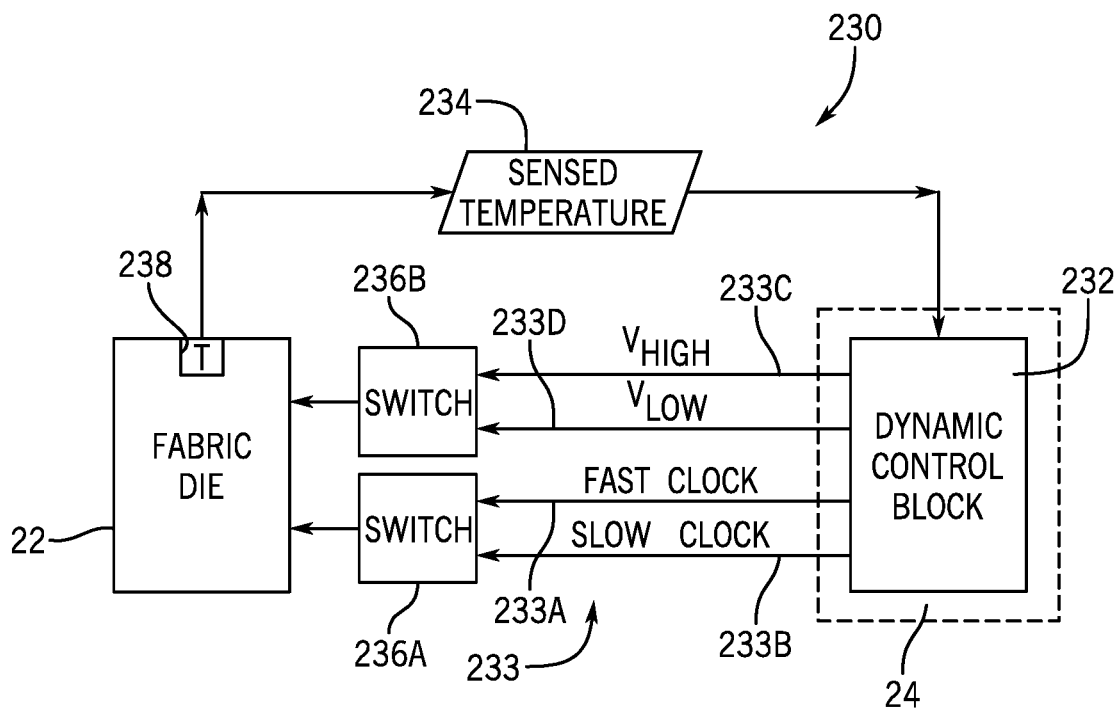
FIG. 17B is a block diagram of a dynamic control system that includes a dynamic control block embedded in the base die of FIG. 17A and operatively coupled to the fabric die of FIG. 17A, in accordance with an embodiment.

Dynamic voltage and frequency scaling (DVFS) control techniques may be used to control the temperature of the fabric die 22. FIG. 17B is a block diagram of a dynamic control system 230 that includes a dynamic control block 232 embedded in the base die 24 and operatively coupled to the fabric die 22. The dynamic control block 232 may adjust outputted control signals 233 in response to a received sensed temperature 234 as a way to perform dynamic voltage and frequency scaling.

In general, the sensed temperature 234 may indicate relative processing (e.g., application and/or workload demands) or thermal distributions on the fabric die 22. When the sensed temperature 234 exceeds a programmed threshold associated with the dynamic control block 232, the dynamic control block 232 may adjust its outputted control signals 233. The control signals 233 may control the supply voltage supplied to the fabric die 22 and/or may control a speed or frequency of the clock signal supplied to the fabric die 22. The supply voltage may be supplied from the PDN 110.

The outputted control signals 233 may be transmitted to one or more switches 236. The switches 236 may arbitrate transmission of the respective supply signals to the fabric die 22 in response to the control signals 233. For example, a fast clock control signal 233A may cause the switch 236A to transmit a relatively fast (e.g., higher frequency) clock signal to the fabric die 22. In contrast, a slow clock control signal 233B may cause the switch 236A to transmit a relatively slow (e.g., lower frequency than the higher frequency clock signal) clock signal to the fabric die 22.

In some embodiments, the supply voltage may be adjusted in response to the sensed temperature 234 in addition to or alternative of the clock for the fabric die 22. For example, a high voltage control signal (Vhigh) 233C or a low voltage control signal 233D may be generated by the dynamic control block 232 in response to the sensed temperature 234. For example, if the fabric die 22 temperature is determined to be relatively high, the low voltage control signal 233D may be enabled by the dynamic control block 232. The switch 236B may control the supply voltage amount in response to the low voltage control signal 233D such that the supply voltage to the fabric die 22 is decreased.

Through basing the output of the control signals 233 on the temperature sensing of the fabric die 22, performance of the fabric die 22 may be throttled and/or adjusted in response to the sensed temperature 234. In this way, when a thermal sensor 238 of the fabric die 22 detects a relatively high temperature, outputted control signals 233 may help to adjust the performance of the fabric die 22. It should be noted that any suitable number of thermal sensors 238 may be used within the fabric die 22 or within any suitable portion of the multi-dimensional programmable logic device 12 (e.g., such as within the base die 24 as thermal sensors 97). Additionally or alternatively, any suitable type of switching device may be used as the switch 236 including any combination of transistors (e.g., metal-oxide-semiconductor field-effect transistors (MOSFETs), insulated-gate bipolar transistors (IGBTs)), combinational logic, or the like.

Figure 18:
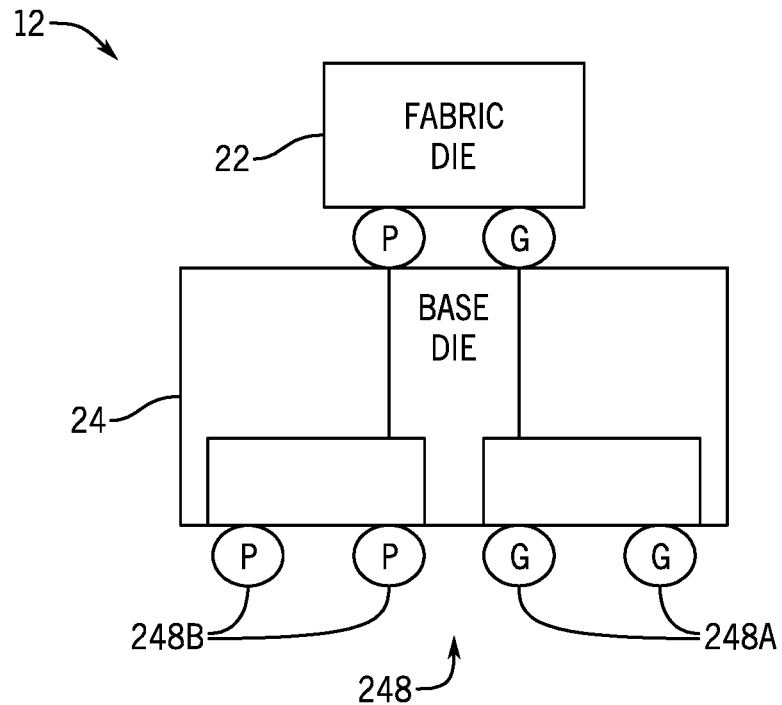
FIG. 18 is a block diagram of an example fabric die of a programmable logic device stacked on a base die operating as an active interposer and including redundant couplings, in accordance with an embodiment.

Additionally or alternatively, another cooling technique may be to include of redundant couplings in the base die 24 (e.g., active interposer). FIG. 18 is a block diagram of an example fabric die 22 of a multi-dimensional programmable logic device 12 stacked on a base die 24 operating as an active interposer and including redundant couplings 248. The redundant couplings 248 may leverage additional and/or surplus physical area of the base die 24 to improve lifetime reliability associated with power and/or ground couplings between the fabric die 22 and a power supply or system ground. The redundant couplings also may improve thermal performance of the multi-dimensional programmable logic device 12.

As depicted, each coupling 250 (e.g., such as microbumps 26, microbumps 38) may correspond to two redundant couplings 248. It should be understood that although depicted as a 2:1 ratio of redundant couplings 248 to couplings 250, any suitable ratio may be used if a number of redundant couplings 248 exceeds a number of couplings 250. Different redundant couplings 248 may be included for ground redundant couplings 248A and for power supply redundant couplings 248B. The redundant couplings 248 may improve overall product reliability while not including the redundant couplings 248 directly within or from the fabric die 22. The general offloading of the redundant couplings 248 to the base die 24 permits improvements in space utilization associated with the fabric die 22, since the size of the fabric die 22 does not increase to fit the redundant couplings 248.

Usage of Power Management Techniques in a Data Processing System

Figure 19:
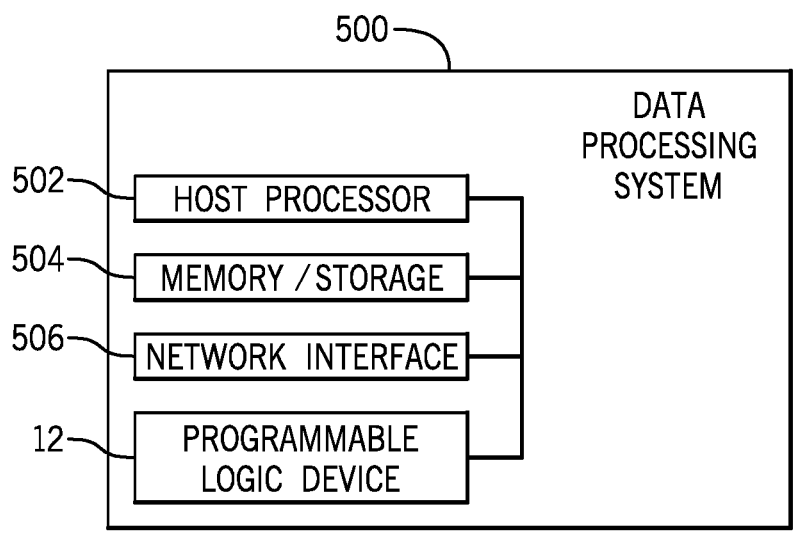
FIG. 19 is a block diagram of a data processing system that may use the programmable logic device to respond rapidly to data processing requests, in accordance with an embodiment.

With the foregoing in mind, the programmable logic device 12 may be a data processing system or may be a component of a data processing system that may benefit from application of one of the many power management techniques described herein. For example, the programmable logic device 12 may be a component of a data processing system 500, shown in FIG. 19. The data processing system 500 includes a host processor 502, memory and/or storage circuitry 504, and a network interface 506. The data processing system 500 may include more or fewer components (e.g., electronic display, user interface structures, application specific integrated circuits (ASICs)). The host processor 502 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 500 (e.g., to perform machine learning, video processing, voice recognition, image recognition, data compression, database search ranking, bioinformatics, network security pattern identification, spatial navigation, or the like). The memory and/or storage circuitry 504 may include random access memory (RAM), read-only memory (ROM), one or more hard drives, flash memory, or the like. The memory and/or storage circuitry 504 may be considered external memory to the programmable logic device 12 and may hold data to be processed by the data processing system 500. In some cases, the memory and/or storage circuitry 504 may also store configuration programs (e.g., bitstream) for programming the programmable logic device 12. The network interface 506 may permit the data processing system 500 to communicate with other electronic devices. The data processing system 500 may include several different packages or may be contained within a single package on a single package substrate.

In one example, the data processing system 500 may be part of a data center that processes a variety of different requests. For instance, the data processing system 500 may receive a data processing request via the network interface 506 to perform machine learning, video processing, voice recognition, image recognition, data compression, database search ranking, bioinformatics, network security pattern identification, spatial navigation, or some other specialized task. The host processor 502 may cause the programmable logic fabric of the programmable logic device 12 to be programmed with a particular accelerator related to requested task. For instance, the host processor 502 may instruct that configuration data (bitstream) stored on the memory/storage circuitry 504 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 500 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which may permit the occurrence of the processing operations at various intervals associated with the processing, as long as the processing of overlying operations is performed as desired.

Thus, the technical effects of the present disclosure include improvements to power management techniques for multi-dimensional programmable logic devices or any suitable integrated circuit device. Techniques include leveraging an active interposer (e.g., an active interposer circuit) as a base die that one or more fabric die or other functional blocks of the programmable logic device are disposed on. For example, the base die functioning as an active interposer may include temperature sensors to facilitate dual consideration design techniques during placement and routing of circuit designs in the fabric die. In some embodiments, the base die may include an application specific integrated circuit (ASIC) that leverages intrinsic capacitance of the fabric die to mitigate noise associated with a power distribution network (PDN) of the programmable logic device and/or generates an artificial current to reduce noise contributions from current steps. Furthermore, in some embodiments, the base die functioning as an active interposer includes a fully integrated voltage regulator (either programmable or non-programmable) to reduce a reliance of the fabric die on a device power supply to permit usage of voltage identification bit control techniques in multi-dimensional device applications. Techniques described herein also include the base die functioning as an active interposer and including a dynamic control block to perform clock frequency and/or supply voltage scaling in response to sensed temperatures. Furthermore, each of these techniques may be used in addition to or alternative of including redundant couplings in the base die to improve lifetime reliability of power couplings and ground couplings. By using one or more of these techniques described herein, a multi-dimensional programmable logic device may at least experience reduced PDN noise and/or dynamic performance control of the programmable logic device in response to sensed temperature of components (e.g., fabric die) of the programmable logic device.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An integrated circuit device comprising:
   an integrated circuit die comprising embedded memory, programmable logic fabric, a first portion of a power distribution network, and first interface circuitry;
   an active interposer circuit comprising fabric support circuitry, a second portion of the power distribution network, and second interface circuitry, wherein the active interposer circuit is configured to perform at least a portion of processing operations associated with the programmable logic fabric, and wherein the active interposer circuit is configured to regulate the first portion of the power distribution network, the second portion of the power distribution network, or both; and
   a microbump interface that couples the first interface circuitry of the integrated circuit die to the second interface circuitry of the active interposer circuit, wherein the microbump interface is configured to exchange data between the integrated circuit die and the active interposer circuit.

2. The integrated circuit device of claim 1, wherein the active interposer circuit is configured to regulate a voltage of the programmable logic fabric by regulating the power distribution network.

3. The integrated circuit device of claim 2, wherein the active interposer circuit is configured to reduce noise of the power distribution network via an intrinsic capacitance of the programmable logic fabric.

4. The integrated circuit device of claim 3, wherein the intrinsic capacitance is tuned based at least in part on a toggling factor that controls switching of components included within the programmable logic fabric.

5. The integrated circuit device of claim 2, wherein the active interposer circuit is configured to generate an artificial current demand during a duration of time corresponding to low activity of the integrated circuit die.

6. The integrated circuit device of claim 1, wherein the active interposer circuit comprises a thermal sensor configured to sense a temperature associated with the active interposer circuit.

7. The integrated circuit device of claim 6, wherein a design software is configured to adjust placement of circuitry functions in the programmable logic fabric based on the temperature of the active interposer circuit sensed by the thermal sensor.

8. The integrated circuit device of claim 1, wherein the active interposer circuit comprises a fully integrated voltage regulator circuit configured to output a lower voltage than an input voltage applied to the fully integrated voltage regulator circuit.

9. The integrated circuit device of claim 8, wherein the fully integrated voltage regulator circuit comprises two or more inductors, two or more capacitors, or any combination thereof, and one or more switching devices to select a subset of the two or more inductors, the two or more capacitors, or any combination thereof.

10. The integrated circuit device of claim 1, wherein the first interface circuitry comprises a first subset of couplings, wherein the second interface circuitry comprises a second subset of couplings, and wherein the second subset of couplings comprises a number of couplings larger than a number of couplings of the first subset of couplings.

11. The integrated circuit device of claim 1, wherein the programmable logic fabric comprises a thermal sensor, and wherein the active interposer circuit comprises a dynamic control block configured to adjust a supply voltage of the programmable logic fabric or a clock signal of the programmable logic fabric based at least in part on a sensed temperature of the programmable logic fabric.

12. An electronic device, comprising:
a fabric die that comprises:
programmable logic fabric;
configuration memory configured to program the programmable logic fabric; and
an active interposer circuit coupled to the fabric die, wherein the programmable logic fabric is configured to access at least a portion of the active interposer circuit to perform an operation;
wherein a power distribution network is distributed across the fabric die and the active interposer circuit, and wherein the active interposer circuit is configured to regulate a voltage on the power distribution network.

13. The electronic device of claim 12, wherein the configuration memory is configured to tune an intrinsic capacitance of the programmable logic fabric based at least in part on toggling factor associated with switching of unused components within the programmable logic fabric.

14. The electronic device of claim 12, wherein the active interposer circuit is configured to generate an artificial current demand during a duration of time corresponding to low activity of the fabric die.

15. The electronic device of claim 12, wherein the programmable logic fabric comprises a thermal sensor, wherein the active interposer circuit comprises a dynamic control block configured to adjust a supply voltage of the programmable logic fabric, wherein the supply voltage is transmitted from the power distribution network, and wherein the dynamic control block adjusts the supply voltage based at least in part on a sensed temperature of the programmable logic fabric.

16. The electronic device of claim 12, wherein the active interposer circuit comprises a programmable voltage regulator circuit configured to adjust a supply voltage to the programmable logic fabric from the power distribution network based at least in part on a current usage of the programmable logic fabric.

* * * * *